United States Patent
Yeung et al.

(10) Patent No.: US 10,522,636 B2
(45) Date of Patent: Dec. 31, 2019

(54) FIN FIELD-EFFECT TRANSISTOR FOR INPUT/OUTPUT DEVICE INTEGRATED WITH NANOSHEET FIELD-EFFECT TRANSISTOR

(71) Applicant: International Business Machines Corporation, Armonk, NY (US)

(72) Inventors: Chun Wing Yeung, Niskayuna, NY (US); Chen Zhang, Albany, NY (US); Peng Xu, Santa Clara, CA (US); Huiming Bu, Glenmont, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/261,847

(22) Filed: Jan. 30, 2019

(65) Prior Publication Data

US 2019/0198629 A1    Jun. 27, 2019

Related U.S. Application Data

(62) Division of application No. 15/852,214, filed on Dec. 22, 2017, now Pat. No. 10,297,667.

(51) Int. Cl.
*H01L 29/417* (2006.01)
*H01L 29/06* (2006.01)
(Continued)

(52) U.S. Cl.
CPC .... *H01L 29/41791* (2013.01); *H01L 29/0665* (2013.01); *H01L 29/0673* (2013.01);
(Continued)

(58) Field of Classification Search
None
See application file for complete search history.

(56) References Cited

U.S. PATENT DOCUMENTS 6,909,147 B2    6/2005    Aller et al.
8,253,186 B2    8/2012    Kumazaki
(Continued)

FOREIGN PATENT DOCUMENTS

WO    2015195134 A1    12/2015

OTHER PUBLICATIONS

List of IBM Patents or Patent Applications Treated as Related.

*Primary Examiner* — Peter Bradford
(74) *Attorney, Agent, or Firm* — Vazken Alexanian; Ryan, Mason & Lewis, LLP

(57) ABSTRACT

A method of forming a semiconductor structure includes forming a nanosheet stack disposed over a first portion of a substrate and a fin channel material disposed over a second portion of the substrate, patterning the nanosheet stack disposed over the first portion of the substrate to form two or more nanosheet channels for at least one nanosheet field-effect transistor, patterning the fin channel material disposed over the second portion of the substrate to form one or more fins for at least one fin field-effect transistor, forming a first dielectric layer surrounding the nanosheet channels and the one or more fins, patterning a mask layer over the one or more fins, removing the first dielectric layer surrounding the nanosheet channels, removing the mask layer, forming a second dielectric layer surrounding the nanosheet channels and over the first dielectric layer surrounding the one or more fins, and forming a gate conductive layer over the second dielectric layer.

20 Claims, 23 Drawing Sheets

(51) Int. Cl.
*H01L 29/78* (2006.01)
*H01L 29/66* (2006.01)
*H01L 29/786* (2006.01)

(52) U.S. Cl.
CPC .. *H01L 29/66439* (2013.01); *H01L 29/66469* (2013.01); *H01L 29/66545* (2013.01); *H01L 29/66742* (2013.01); *H01L 29/66772* (2013.01); *H01L 29/66795* (2013.01); *H01L 29/785* (2013.01); *H01L 29/78606* (2013.01); *H01L 29/78654* (2013.01); *H01L 29/78681* (2013.01); *H01L 29/78696* (2013.01)

(56) References Cited

U.S. PATENT DOCUMENTS

| | | | |
|---|---|---|---|
| 9,331,204 B2 | 5/2016 | Lue | |
| 9,490,335 B1 | 11/2016 | Doris et al. | |
| 9,991,254 B1* | 6/2018 | Cheng | H01L 21/02532 |
| 10,109,533 B1* | 10/2018 | Xie | H01L 21/823821 |
| 2015/0263173 A1 | 9/2015 | Lue | |
| 2016/0111284 A1 | 4/2016 | Kittl et al. | |
| 2018/0197785 A1* | 7/2018 | Cheng | H01L 21/823462 |

* cited by examiner

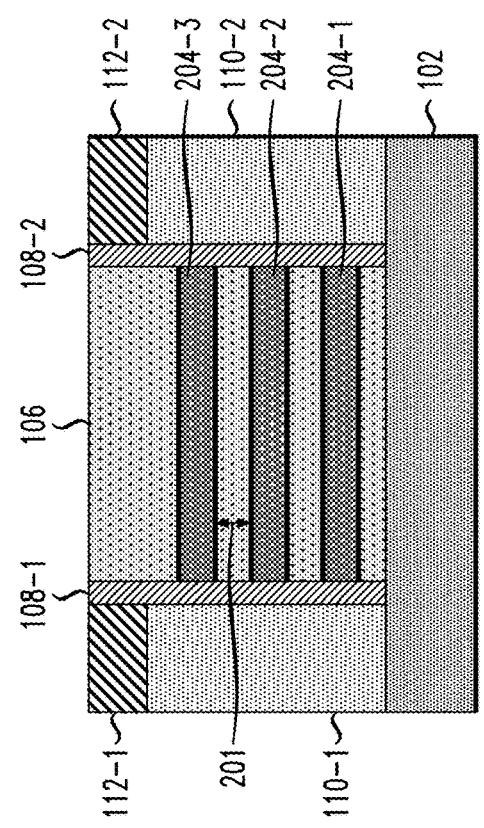
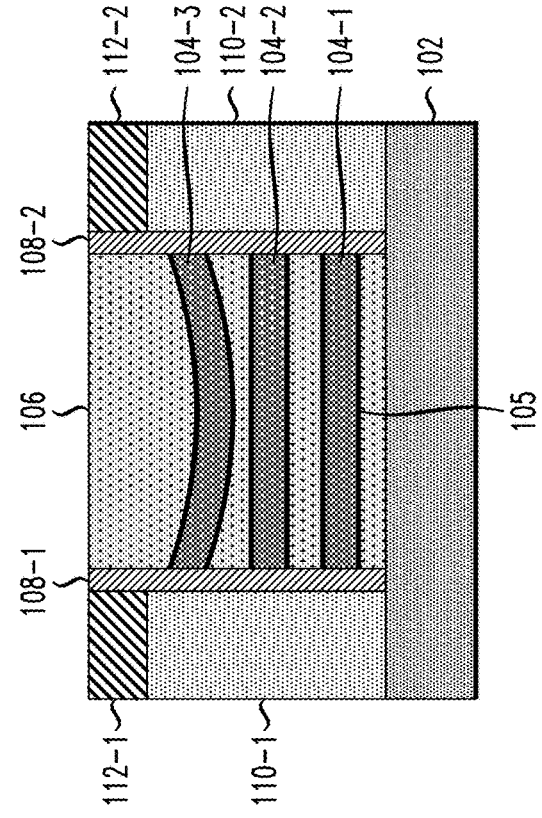

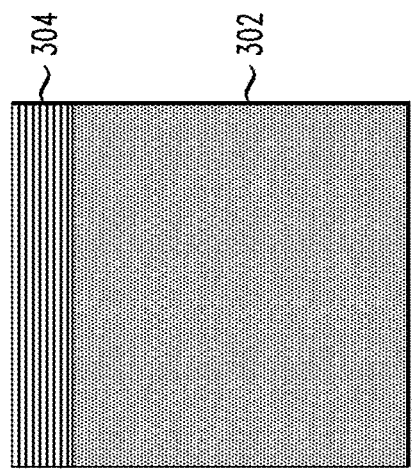
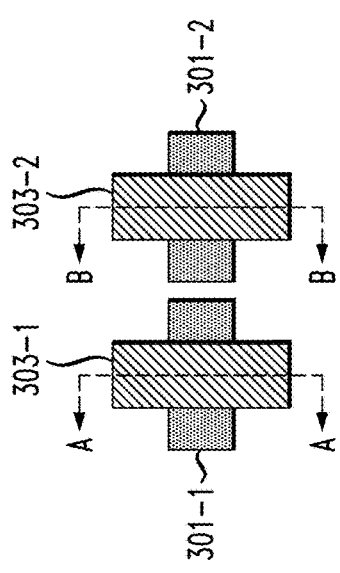
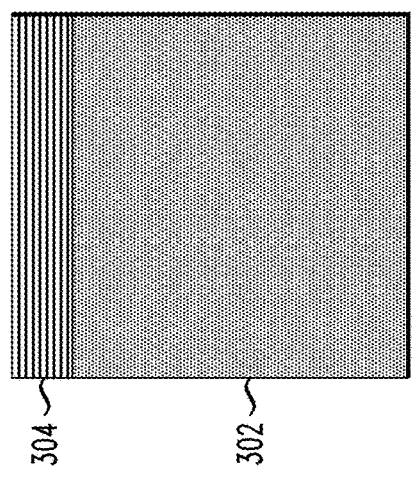

450

475

400

550

575

500

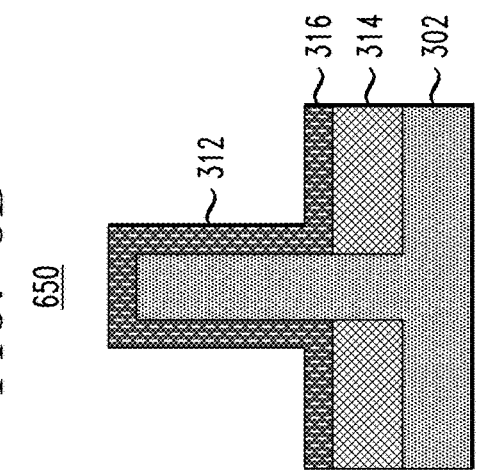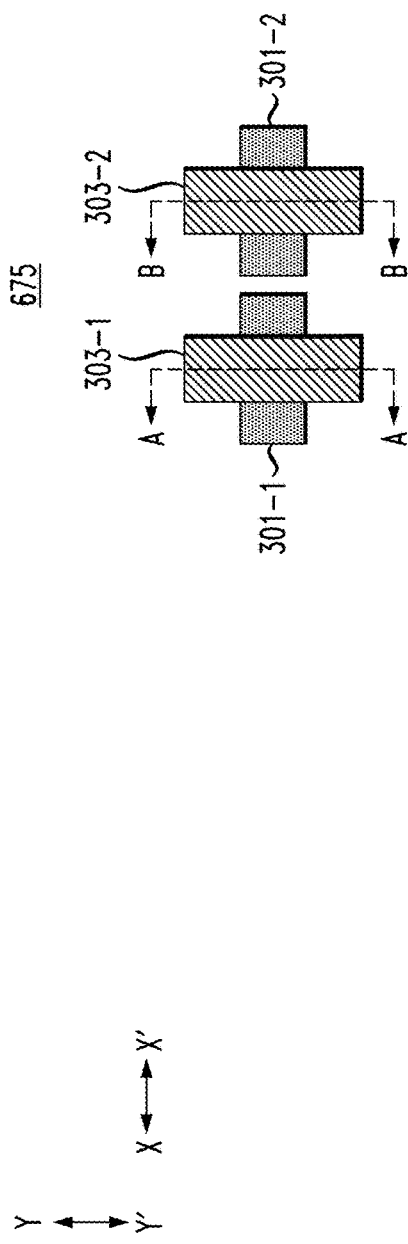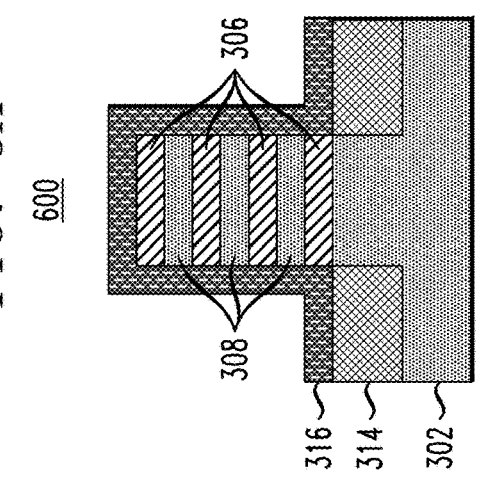

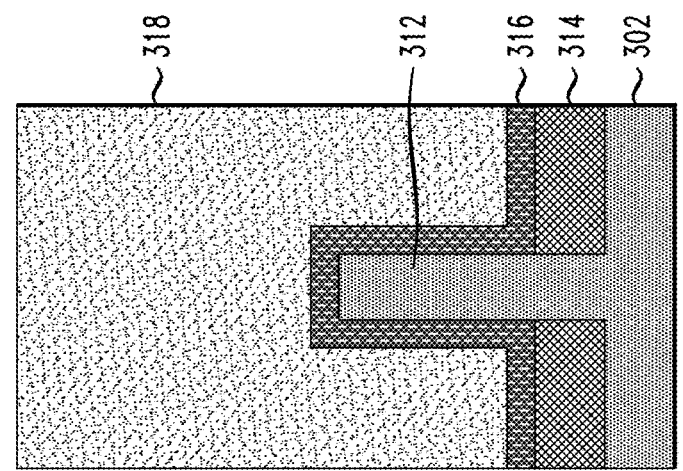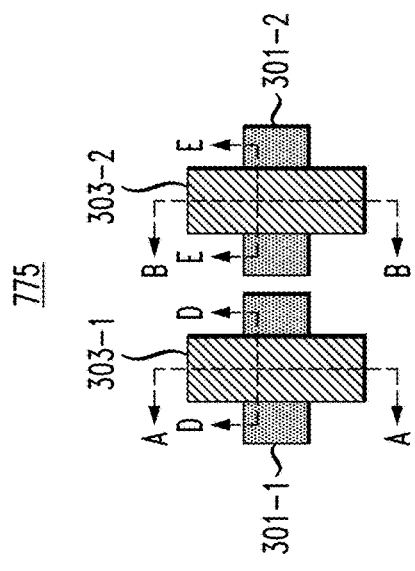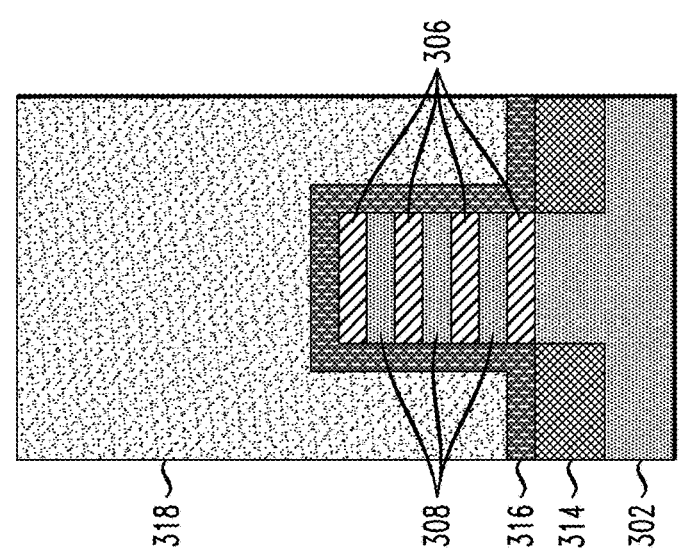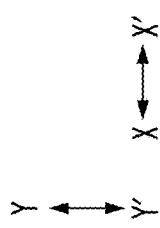

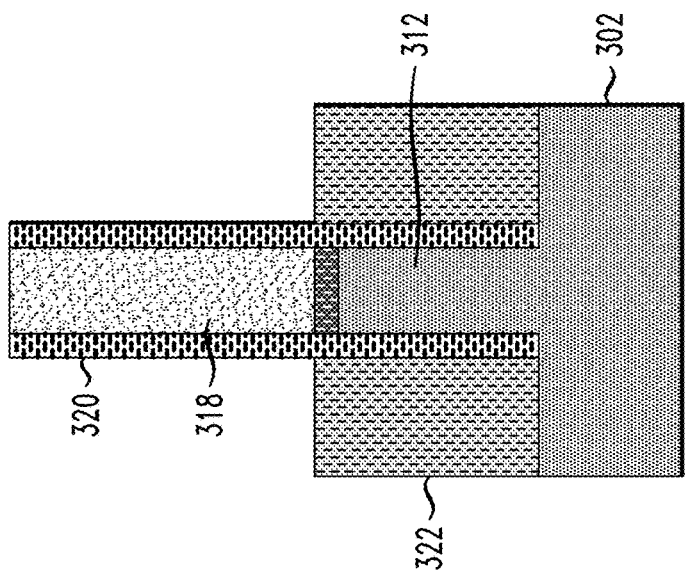
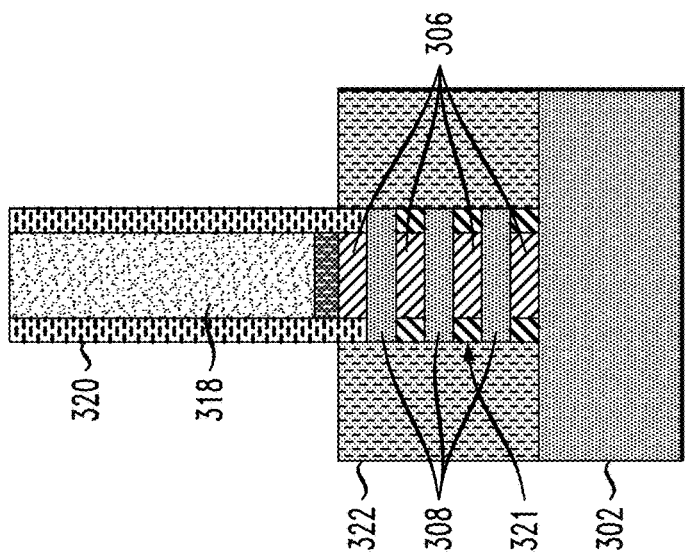
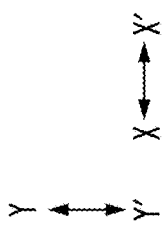

850

875

800

950

975

900

1050

1075

1000

1095

1085

1150

1175

1100

1250

1275

1200

1350

1375

1300

1450

1475

1400

1550

1575

1500

1650

1675

1600

1750

1775

1700

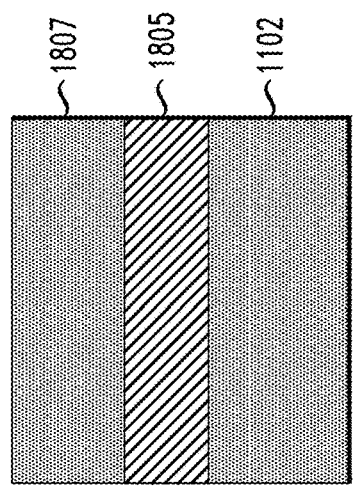
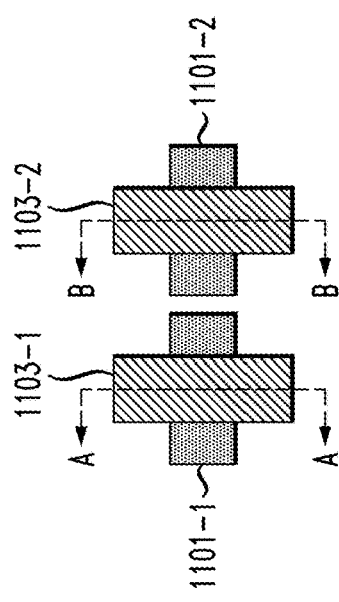
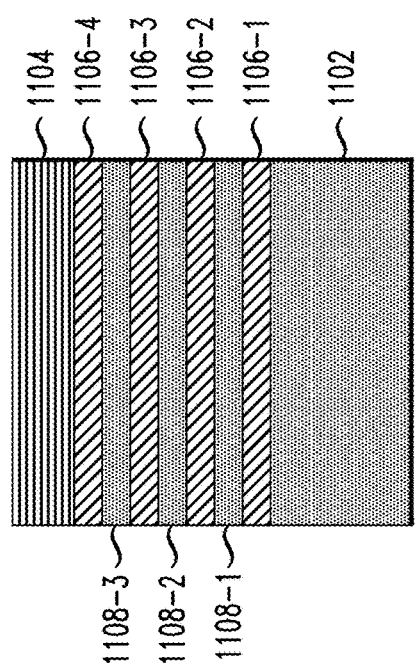

1950

1975

1900

2050

2075

2000

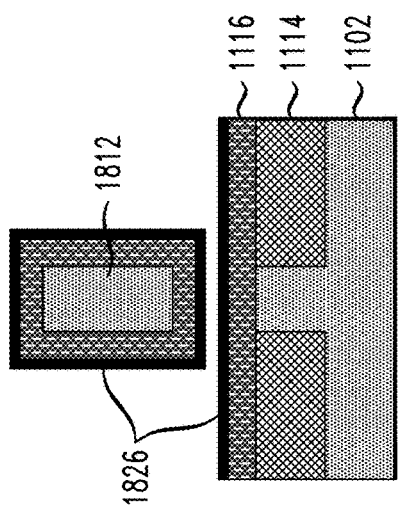
FIG. 21B
2150
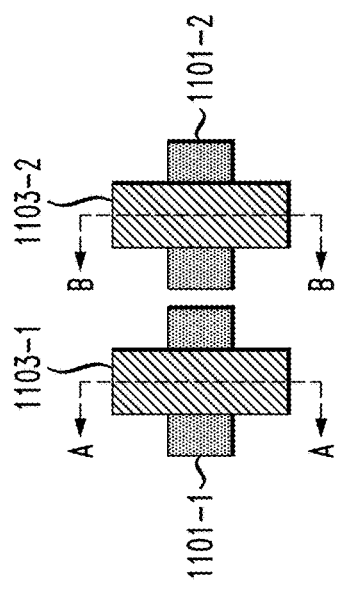
FIG. 21C
2175
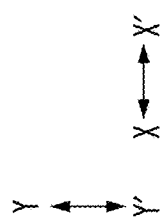
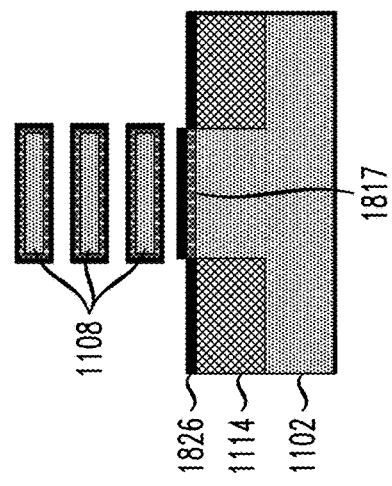
FIG. 21A
2100

FIN FIELD-EFFECT TRANSISTOR FOR INPUT/OUTPUT DEVICE INTEGRATED WITH NANOSHEET FIELD-EFFECT TRANSISTOR

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field effect transistors (FETs), and capacitors.

SUMMARY

Embodiments of the invention provide techniques for co-integrating fin field-effect transistor (FinFET) and nanosheet field-effect transistor (FET) process flows, permitting formation of FinFET input/output (I/O) devices with nanosheet FET technology.

In one embodiment, a method of forming a semiconductor structure includes forming a nanosheet stack disposed over a first portion of a substrate and a fin channel material disposed over a second portion of the substrate, patterning the nanosheet stack disposed over the first portion of the substrate to form two or more nanosheet channels for at least one nanosheet FET, patterning the fin channel material disposed over the second portion of the substrate to form one or more fins for at least one FinFET, forming a first dielectric layer surrounding the nanosheet channels and the one or more fins, patterning a mask layer over the one or more fins, removing the first dielectric layer surrounding the nanosheet channels, removing the mask layer, forming a second dielectric layer surrounding the nanosheet channels and over the first dielectric layer surrounding the one or more fins, and forming a gate conductive layer over the second dielectric layer.

In another embodiment, a semiconductor structure comprises a substrate, two or more nanosheet channels of at least one nanosheet FET disposed over a first portion of the substrate, one or more fins of at least one FinFET disposed over a second portion of the substrate, a first dielectric layer disposed surrounding the one or more fins, a second dielectric layer disposed surrounding the two or more nanosheet channels and the first dielectric layer, and a gate conductive layer disposed surrounding the second dielectric layer.

In another embodiment, an integrated circuit comprises a semiconductor device having at least one nanosheet FET and at least one FinFET. The semiconductor device comprises a substrate, two or more nanosheet channels of said at least one nanosheet FET disposed over a first portion of the substrate, one or more fins of said at least one FinFET disposed over a second portion of the substrate, a first dielectric layer disposed surrounding the one or more fins, a second dielectric layer disposed surrounding the two or more nanosheet channels and the first dielectric layer, and a gate conductive layer disposed surrounding the second dielectric layer.

BRIEF DESCRIPTION OF THE DRAWINGS

FIG. 1 depicts a side cross-sectional view of a stacked nanosheet semiconductor structure exhibiting sheet collapse, according to an embodiment of the invention.

FIG. 2 depicts a side cross-sectional view of a stacked nanosheet semiconductor structure illustrating suspension thickness, according to an embodiment of the invention.

FIG. 3A depicts a side cross-sectional view of a thin gate dielectric region of a semiconductor structure having a semiconductor substrate with a hard mask formed over a top surface thereof, according to an embodiment of the invention.

FIG. 3B depicts a side cross-sectional view of a thick gate dielectric region of the semiconductor structure having a semiconductor substrate with a hard mask formed over a top surface thereof, according to an embodiment of the invention.

FIG. 3C depicts a top-down view of the thin gate dielectric and thick gate dielectric regions of the semiconductor structure shown in FIGS. 3A and 3B, according to an embodiment of the invention.

FIG. 6A depicts a side cross-sectional view of the FIG. 5A thin gate dielectric region following formation of shallow trench isolation regions in the substrate and deposition of the thick gate dielectric, according to an embodiment of the invention.

FIG. 6B depicts a side cross-sectional view of the FIG. 5B thick gate dielectric region following formation of shallow trench isolation regions in the substrate and deposition of the thick gate dielectric, according to an embodiment of the invention.

FIG. 6C depicts a top-down view of the thin gate dielectric and thick gate dielectric regions of the semiconductor structure shown in FIGS. 6A and 6B, according to an embodiment of the invention.

FIG. 7A depicts a first side cross-sectional view of the FIG. 6A thin gate dielectric region following formation of dummy gates, spacer deposition, spacer and fin etching, inner spacer formation, and growth of epitaxial layers for source/drain regions, according to an embodiment of the invention.

FIG. 7B depicts a first side cross-sectional view of the FIG. 6B thick gate dielectric region following formation of dummy gates, spacer deposition, spacer and fin etching, inner spacer formation, and growth of epitaxial layers for source/drain regions, according to an embodiment of the invention.

FIG. 7C depicts a top-down view of the thin gate dielectric and thick gate dielectric regions of the semiconductor structure illustrated in FIGS. 7A, 7B, 7D and 7E, according to an embodiment of the invention.

FIG. 7D depicts a second side cross-sectional view of the FIG. 6A thin gate dielectric region following formation of dummy gates, spacer deposition, spacer and fin etching, inner spacer formation, and growth of epitaxial layers for source/drain regions, according to an embodiment of the invention.

FIG. 7E depicts a second side cross-sectional view of the FIG. 6B thick gate dielectric region following formation of dummy gates, spacer deposition, spacer and fin etching, inner spacer formation, and growth of epitaxial layers for source/drain regions, according to an embodiment of the invention.

FIG. 18A depicts a side cross-sectional view of the FIG. 12A thin gate dielectric region, showing the nanosheet stack in the thin gate dielectric region protected by the hard mask during selective epitaxial growth in the thick gate dielectric region, according to an embodiment of the invention.

FIG. 18B depicts a side cross-sectional view of the FIG. 12B thick gate dielectric region following first and second selective epitaxial growths in the thick gate dielectric region, according to an embodiment of the invention.

FIG. 18C depicts a top-down view of the thin gate dielectric and thick gate dielectric regions of the semiconductor structure shown in FIGS. 18A and 18B, according to an embodiment of the invention.

FIG. 21A depicts a side cross-sectional view of the FIG. 20A thin gate dielectric region following removal of the thick gate dielectric material in the thin gate dielectric region and formation of the thin gate dielectric material, according to an embodiment of the invention.

FIG. 21B depicts a side cross-sectional view of the FIG. 20B thick gate dielectric region following formation of the thin gate dielectric material, according to an embodiment of the invention.

FIG. 21C depicts a top-down view of the thin gate dielectric and thick gate dielectric regions of the semiconductor structure shown in FIGS. 21A and 21B, according to an embodiment of the invention.

DETAILED DESCRIPTION

Figure 4B:
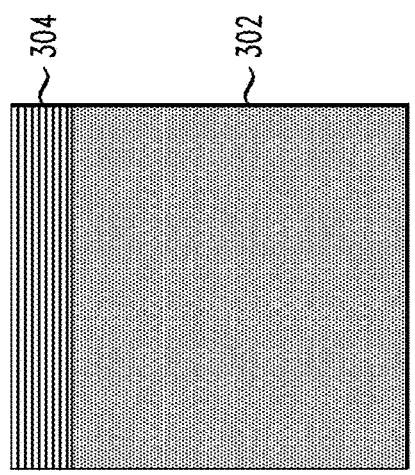
FIG. 4B depicts a side cross-sectional view of the FIG. 3B thick gate dielectric region, showing the hard mask protecting the thick gate dielectric region during formation of the nanosheet stack in the thin gate dielectric region, according to an embodiment of the invention.

Illustrative embodiments of the invention may be described herein in the context of illustrative methods for co-integrating fin field-effect transistor (FinFET) and nanosheet (field-effect transistor (FET) processing flows, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A FET is a transistor having a source, a gate, and a drain, and having action that depends on the flow of majority carriers along a channel that runs past the gate between the source and drain. Current through the channel between the source and drain may be controlled by a transverse electric field under the gate. The length of the gate determines how fast the FET switches, and can be about the same as the length of the channel (such as the distance between the source and drain).

In some FETs, more than one gate or multi-gate arrangements may be used for controlling the channel. Multi-gate FETs are promising candidates to scale down complementary metal-oxide-semiconductor (CMOS) FET technology. However, the smaller dimensions associated with multi-gate FETs (as compared to single-gate FETs) necessitate greater control over performance issues such as short channel effects, punch-through, metal-oxide semiconductor (MOS) leakage current, and the parasitic resistance that is present in a multi-gate FET.

Various techniques may be used to reduce the size of FETs. One technique is through the use of fin-shaped channels in FinFET devices. Before the advent of FinFET arrangements, CMOS devices were typically substantially planar along the surface of the semiconductor substrate, with the exception of the FET gate disposed over the top of the channel. FinFETs utilize a vertical channel structure, increasing the surface area of the channel exposed to the gate. Thus, in FinFET structures the gate can more effectively control the channel, as the gate extends over more than one side or surface of the channel. In some FinFET arrangements, the gate encloses three surfaces of the three-dimensional channel, rather than being disposed over just the top surface of a traditional planar channel.

FinFETs may also be used to define more than one type of dielectric device on one semiconductor substrate. For example, both a thin gate dielectric device and a thick gate dielectric device can be employed on the same semiconductor substrate. In manufacturing a CMOS device having both thin gate dielectric and thick gate dielectric devices, a hard mask is generally deposited on the top of each of the fins, and a thick coating of silicon dioxide ($SiO_2$) is conformally deposited on the hard mask and sides of the fins. A photoresist layer is then selectively applied to the fins of the thin gate dielectric device, and lithographic and etching techniques are used to remove the thick coating of $SiO_2$ not protected by the photoresist layer.

Another technique useful for reducing the size of FETs is through the use of stacked nanosheet channels formed over a semiconductor substrate. Stacked nanosheets may be two-dimensional nanostructures, such as sheets having a thickness range on the order of 1 to 100 nanometers (nm). Nanosheets and nanowires are viable options for scaling to 7 nm and beyond. A general process flow for formation of a nanosheet stack involves removing sacrificial layers, which may be formed of silicon germanium (SiGe), between sheets of channel material, which may be formed of silicon (Si).

For nanosheet technology, a thick gate dielectric device (e.g., a long channel with thick oxide or other dielectric) offering for input/output (I/O) is essential. Stacked nanosheet technology, however, lacks a thick gate dielectric solution due to a number of factors. First, as illustrated in the side cross-sectional view 100 of FIG. 1, there is a risk of sheet collapse when channel length is longer than 100 nm. Second, as illustrated in the side cross-sectional view 200 of FIG. 2, the suspension thickness ($T_{sus}$) may be too small (e.g., approximately 9 nm or less) to be filled with both a thick oxide or other dielectric and a work functional metal (WFM) or other conductive material for the gate.

FIG. 1 shows a side cross-sectional view 100 of a semiconductor structure, with a substrate 102 and a nanosheet channel stack comprising nanosheets 104-1, 104-2, 104-3 (collectively, nanosheet stack 104) formed over the substrate 102. The substrate 102 may be formed of bulk silicon, although other suitable materials may be used. The nanosheets in nanosheet stack 104 may also be formed of Si. Each of the nanosheets in the nanosheet stack 104 is surrounded by a thin gate dielectric 105. A WFM or other conductive gate material 106 surrounds the thin gate dielectric 105. Spacers 108-1 and 108-2 (collectively, spacers 108) are formed adjacent the nanosheet stack 104 over the substrate 102. The spacers 108 may be formed of silicon nitride (SiN), silicon oxycarbonitride (SiOCN), silicon boron carbide nitride (SiBCN) or another suitable material. On either side of the spacers 108, source/drain epitaxial layers 110-1 and 110-2 (collectively, source/drain epitaxial layers 110) are formed. The source/drain epitaxial layers 110 may be formed of highly doped silicon (Si) or silicon germanium (SiGe) although other suitable materials may be used. Source/drain contacts 112-1 and 112-2 (collectively, source/drain contacts 112) are formed over the source/drain epitaxial layers 110. The source/drain contacts 112 may be formed of titanium (Ti), tungsten (W) or another suitable material.

As illustrated in FIG. 1, there is a risk of sheet collapse as the length of the nanosheets increases (e.g., such as a channel length longer than 100 nm). For example, nanosheet 104-3 in FIG. 1 exhibits sheet collapse.

FIG. 2 shows a side cross-sectional view 200 of a semiconductor structure similar to that of FIG. 1, where like reference numerals denote like elements. FIG. 2, however, illustrates $T_{sus}$ 201 of nanosheets 204-1, 204-2 and 204-3 (collectively, nanosheet stack 204). If the $T_{sus}$ 201 is too small (e.g., approximately 9 nm), then there may not be sufficient room to fill regions between the nanosheets in nanosheet stack 204 with both: (i) a thick oxide or other thick gate dielectric; and (ii) a WFM or other conductive gate material.

Embodiments provide a nanosheet compatible process flow for co-integrating FinFET and nanosheet processing flows. Thus, FinFETs can be used as thick gate dielectric devices, with long channels and thick oxide. In some embodiments, a FinFET is ultra-tall (e.g., approximately 65 nm) to ensure full compatibility to nanosheet front end-of-line (FEOL) processes and provide additional drive current at the same footprint. Advantageously, the FinFET and nanosheet processing flows may be co-integrated while only requiring one additional mask.

Illustrative processes for co-integrating FinFET and nanosheet processing flows will now be described with respect to FIGS. 3-21.

FIG. 3A depicts a side cross-sectional view 300 of a thin gate dielectric region of a semiconductor structure. The thin gate dielectric region, which will be used to form a thin gate dielectric device, will use nanosheet FET technology. As shown, the structure includes a substrate 302 with a hard mask 304 patterned over a top surface thereof. FIG. 3B depicts a side cross-sectional view 350 of a thick gate dielectric region of a semiconductor structure. The thick gate dielectric region, which will be used to form a thick gate dielectric device, will use FinFET technology. Similar to the thin gate dielectric region, the thick gate dielectric region has substrate 302 with hard mask 304 patterned over a top surface thereof.

FIG. 3C depicts a top-down view 375 of the semiconductor structure illustrated in FIGS. 3A and 3B. The top-down view 375 more particularly illustrates source/drain regions 301-1 and 301-2 (collectively, source/drain regions 301), and gate regions 303-1 and 303-2 (collectively, source/drain regions 303). The source/drain regions 301 and gate regions 303 are formed on a common substrate (e.g., substrate 302). The side cross-sectional view 300 of FIG. 3A is taken along the line A-A in FIG. 3C, e.g., across the gate region 303-1. The side cross-sectional view 350 of FIG. 3B is taken along the line B-B in FIG. 3C, e.g., across the gate region 303-2. It is to be appreciated that multiple thin gate dielectric and thick gate dielectric devices may be formed as desired in these and other gate regions. The top-down view 375 of FIG. 3C, as well as other top-down views described herein, are presented to show where the various side cross-sectional views of other figures are taken, and omit details of underlying layers for clarity of illustration.

The substrate 302 may be a semiconductor structure formed of bulk silicon (Si), although other suitable materials may be used, such as various silicon-containing materials. Illustrative examples of silicon-containing materials suitable for the substrate 302 include, but are not limited to, Si, silicon germanium (SiGe), silicon germanium carbide (SiGeC), silicon carbide (SiC), polysilicon, epitaxial silicon, amorphous silicon, and multi-layers thereof. Although silicon is the predominantly used semiconductor material in wafer fabrication, alternative semiconductor materials can be employed, such as, but not limited to, germanium (Ge), gallium arsenide (GaAs), gallium nitride (GaN), cadmium telluride (CdTe) and zinc selenide (ZnSe). In an alternate embodiment, the substrate 302 may be silicon-on-insulator (SOI) wafer. As is known in the art, a SOI wafer includes a SOI layer separated from a substrate by a buried insulator. Suitable substrate materials include, but are not limited to, Si, strained Si, silicon carbide (SiC), Ge, SiGe, SiGeC, Si alloys, Ge alloys, GaAs, indium arsenide (InAs), indium phosphide (InP), or any combination thereof. Suitable dielectric materials for the buried insulator include, but are not limited to, an oxide material such as silicon dioxide ($SiO_2$). When the buried insulator is an oxide, the buried insulator may also be referred to as a buried oxide or BOX.

The substrate 302 may have a width or horizontal thickness (in direction X-X') that varies as desired. The substrate 302 may have a height or vertical thickness (in direction Y-Y') ranging from 300 micrometers (μm) to 1000 μm.

The hard mask 304 may be formed of a nitride, oxide, an oxide-nitride bilayer, or another suitable material. In some embodiments, the hard mask 304 may comprise an oxide such as silicon oxide (SiO), a nitride such as silicon nitride (SiN), an oxynitride such as silicon oxynitride (SiON), combinations thereof, etc. In some embodiments, the hard mask 304 is a silicon nitride such as $Si_3N_4$. The width or horizontal thickness (in direction X-X') of the hard mask 304 matches that of the underlying substrate 302. The hard mask 304 may have a height or vertical thickness in a Z or surface normal direction ranging from 10 nanometers (nm) to 50 nm.

Figure 4C:
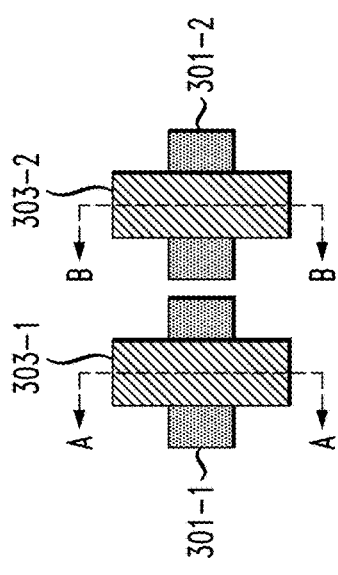
FIG. 4C depicts a top-down view of the thin gate dielectric and thick gate dielectric regions of the semiconductor structure shown in FIGS. 4A and 4B, according to an embodiment of the invention.
Figure 4A:
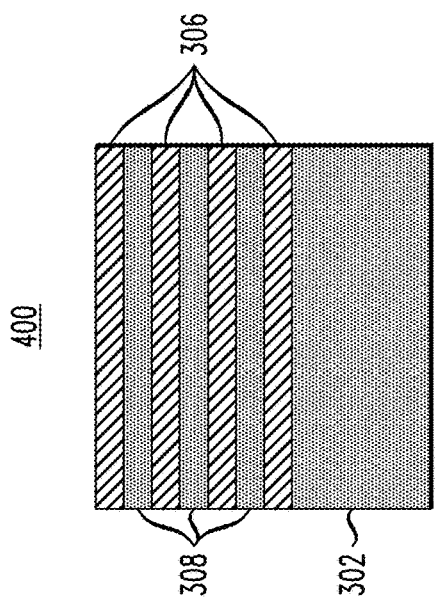
FIG. 4A depicts a side cross-sectional view of the FIG. 3A thin gate dielectric region following removal of the hard mask and formation of a nanosheet stack, according to an embodiment of the invention.

FIG. 4A depicts a side cross-sectional view 400 of the FIG. 3A thin gate dielectric region following removal of the hard mask 304 and formation of a nanosheet stack. The hard mask 304 is removed selectively in the thin gate dielectric region. FIG. 4B depicts a side cross-sectional view 450 of the FIG. 3B thick gate dielectric region, showing that the thick gate dielectric region is protected by the hard mask 304 during formation of the nanosheet stack in the thin gate dielectric region.

The nanosheet stack in the thin gate dielectric region includes alternating layers of a sacrificial material 306 and layers of channel material 308. The sacrificial layers 306 may be formed of any suitable material that may be etched selective to the channel material 308. If the channel material 308 is Si, the sacrificial layers 306 may be SiGe. If the channel material 308 is indium gallium arsenide (InGaAs), the sacrificial layers 306 may be indium aluminum arsenide (InAlAs). Various other combinations of III-V materials may be used. The material of the sacrificial layers 306 is one that can be removed selective to the material of the channel layers 308. The sacrificial layers 306 and channel layers 308 may each have a thickness in the range of 4 nm to 15 nm. The nanosheet stack of sacrificial layers 306 and channel layers 308 may be epitaxially grown over the substrate 302 in the thin gate dielectric region.

The side cross-sectional view 400 of FIG. 4A is taken along the line A-A of the top-down view 475 of FIG. 4C, and the side cross-sectional view 450 of FIG. 4B is taken along the line B-B of the top-down view 475 of FIG. 4C.

Figure 5B:
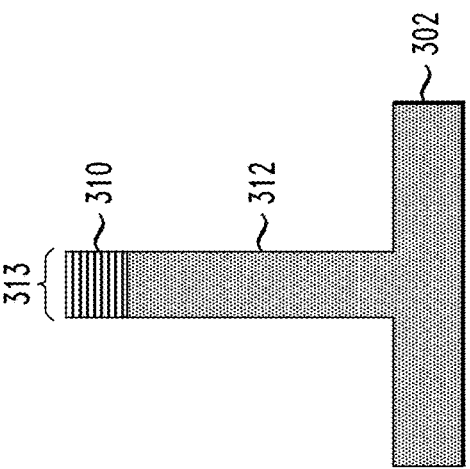
FIG. 5B depicts a side cross-sectional view of the FIG. 4B thick gate dielectric region following patterning of the hard mask and etching to form a fin structure, according to an embodiment of the invention.
Figure 5C:
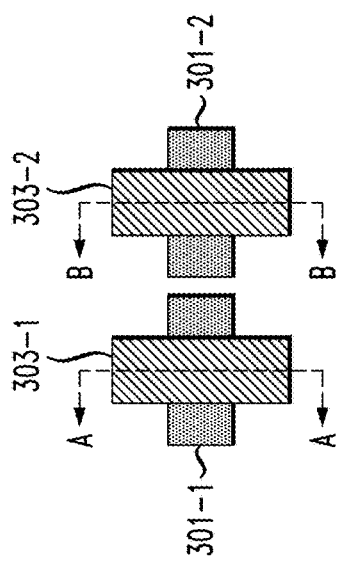
FIG. 5C depicts a top-down view of the thin gate dielectric and thick gate dielectric regions of the semiconductor structure shown in FIGS. 5A and 5B, according to an embodiment of the invention.
Figure 5A:
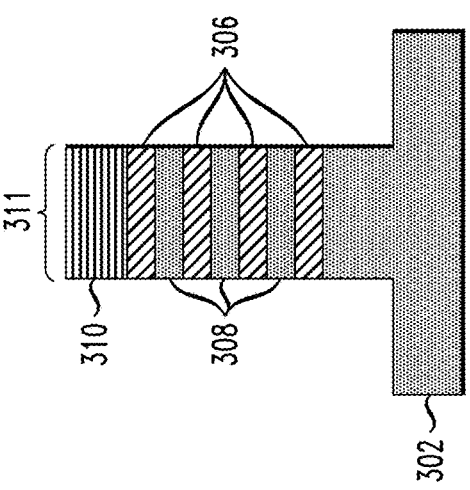
FIG. 5A depicts a side cross-sectional view of the FIG. 4A thin gate dielectric region following patterning of a hard mask and etching the nanosheet stack, according to an embodiment of the invention.

FIG. 5A depicts a side cross-sectional view 500 of the FIG. 4A thin gate dielectric region following patterning of a hard mask 310 over a top surface of the nanosheet stack, and after etching portions of the nanosheet stack exposed by the hard mask 310. As shown, the etching continues through a portion of the substrate 302. As a result of etching of portions of the nanosheet stack, each of the sacrificial layers 306 and channel layers 308 has a sheet width 311 ranging from 10 nm to 50 nm, although other suitable widths may be used depending on device manual support and design requirements.

FIG. 5B depicts a side cross-sectional view 550 of the FIG. 4B thick gate dielectric region following patterning of the hard mask 310 over the top surface of the substrate 302 in the thick gate dielectric region, and after etching portions of the substrate 302 in the thick gate dielectric region that are exposed by the hard mask 310, forming a fin structure 312. The fin structure 312 may have a fin width ($D_{fin}$) 313 ranging from 4 nm to 50 nm. Generally, $D_{fin}$ 313 can be as large as approximately ⅓ to ¼ of the gate length ($L_{gate}$). An upper limit on $D_{fin}$ may be subject to leakage requirements or other electrostatics.

The nanosheet stack and substrate material in the thin gate dielectric and thick gate dielectric regions may be etched using, for example, reactive-ion etching (RIE) although other suitable processes may be used. If the RIE is extreme ultraviolet lithography (EUV) defined, the sheet width 311 and $D_{fin}$ 313 can be different, but patterned and etched simultaneously.

The hard mask 310 may be formed of materials similar to those of the hard mask 304, e.g., SiO, SiN, SiON. It is to be appreciated, however, that the hard mask 304 and the hard mask 310 need not be formed of the same material.

The side cross-sectional view 500 of FIG. 5A is taken along the line A-A of the top-down view 575 of FIG. 5C, and the side cross-sectional view 550 of FIG. 5B is taken along the line B-B of the top-down view 575 of FIG. 5C.

FIG. 6A depicts a side cross-sectional view 600 of the FIG. 5A thin gate dielectric region following formation of shallow trench isolation (STI) regions 314 in portions of the substrate 302 removed during the nanosheet stack etching. The STI regions 314 may be formed of silicon dioxide ($SiO_2$) although other suitable materials may be used. After formation of the STI regions 314, a thick gate dielectric layer 316 is formed over top surfaces of the STI regions 314 and surrounding the nanosheet stack. The thick gate dielectric layer 316, also referred to herein as dielectric layer 316, will later be removed from the thin gate dielectric region as will be described in further detail below.

The dielectric layer 316 may be a thick oxide, although other suitable dielectric materials may be used. The dielectric layer 316 may be formed using a conformal deposition process such as atomic layer deposition (ALD) or plasma-enhanced chemical vapor deposition (PECVD), although other suitable conformal deposition processes may be used. The dielectric layer 316 may have a uniform thickness in the range of 2 nm to 4 nm.

FIG. 6B depicts a side cross-sectional view 650 of the FIG. 5B thick gate dielectric region following formation of STI regions 314 and after deposition of the dielectric layer 316 described above with respect to FIG. 6A. The side cross-sectional view 600 of FIG. 6A is taken along the line A-A of the top-down view 675 of FIG. 6C, and the side cross-sectional view 650 of FIG. 6B is taken along the line B-B of the top-down view 675 of FIG. 6C.

FIGS. 7A-7E depict multiple views of the structure shown in FIGS. 6A and 6B following formation of dummy gates 318, deposition of spacer 320, RIE of the spacer 320 and fin material, formation of inner spacers 321 and growth of source/drain epitaxial layers 322. More particularly, FIG. 7A depicts a first side cross-sectional view 700 of the thin gate dielectric region taken along the line A-A in the top-down view 775 of FIG. 7C, FIG. 7B depicts a first side cross-sectional view 750 of the thick gate dielectric region taken along the line B-B in the top-down view 775 of FIG. 7C, FIG. 7D depicts a second side cross-sectional view 785 of the thin gate dielectric region taken along the line D-D in the top-down view 775 of FIG. 7C, and FIG. 7E depicts a second side cross-sectional view 795 of the thick gate dielectric region taken along the line E-E in the top-down view 775 of FIG. 7C.

The dummy gate 318 may be formed of amorphous silicon (a-Si) although other suitable materials may be used. The dummy gate 318 may have a height or vertical thickness, measured from a top surface of the dielectric layer 316 over STI regions 314, ranging from 80 nm to 150 nm.

The spacer 320 may be formed of silicon nitride ($SiN_X$), SiCBN, SiOCN or another suitable material. The inner spacer 321 may be formed of $SiN_X$ or another suitable material.

The inner spacers 321 are formed in the thin gate dielectric region as a result of the presence of the sacrificial layers 306. While both the thin gate dielectric region and the thick gate dielectric region are exposed to the inner spacer formation process, no inner spacer is formed in the thick gate dielectric region as the thick gate dielectric region does not include a sacrificial layer. In other embodiments, which will be described in further detail below, the thick gate dielectric region may include a sacrificial layer and thus inner spacers may also be formed in a thick gate dielectric region.

The source/drain epitaxial layers 322 may be formed of highly doped Si, although other suitable materials may be used. The source/drain epitaxial layers 322 may have a height or vertical thickness, measured from a top of the substrate 302 in FIGS. 7D/7E, in the range of 40 nm to 80 nm.

Figure 8B:
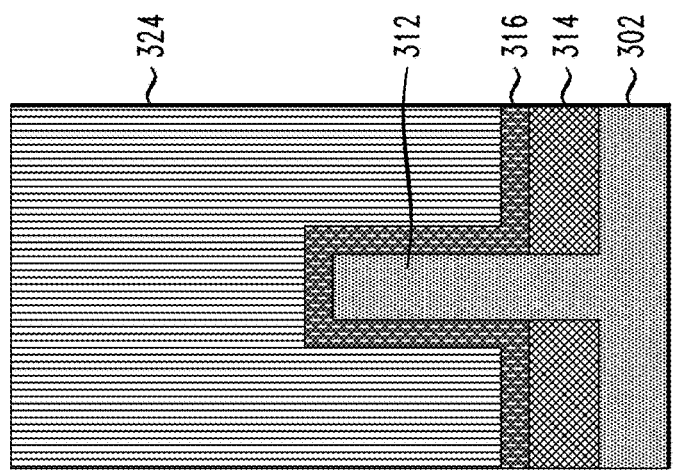
FIG. 8B depicts a side cross-sectional view of the FIG. 7B thick gate dielectric region, showing the thick gate dielectric protected in the thick gate region during removal of the thick gate dielectric in the thin gate dielectric region, according to an embodiment of the invention.
Figure 8C:
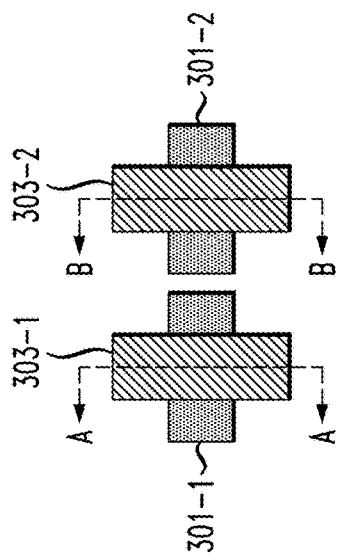
FIG. 8C depicts a top-down view of the thin gate dielectric and thick gate dielectric regions of the semiconductor structure illustrated in FIGS. 8A and 8B, according to an embodiment of the invention.
Figure 8A:
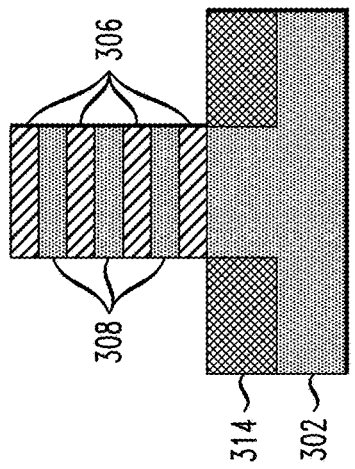
FIG. 8A depicts a side cross-sectional view of the FIG. 7A thin gate dielectric region following removal of the thick gate dielectric in the thin gate dielectric region of the semiconductor structure, according to an embodiment of the invention.

FIG. 8A depicts a side cross-sectional view 800 of the FIG. 7A thin gate dielectric region following removal of the dielectric layer 316 from the thin gate dielectric region. FIG. 8B depicts a side cross-sectional view 850 of the FIG. 7B thick gate dielectric region, showing an organic polymer layer (OPL) 324 formed over the thick gate dielectric region which blocks the thick gate dielectric region while the dielectric layer 316 is removed from the thin gate dielectric region. The side cross-sectional view 800 of FIG. 8A is taken along the line A-A of the top-down view 875 of FIG. 8C, and the side cross-sectional view 850 of FIG. 8B is taken along the line B-B of the top-down view 875 of FIG. 8C.

Figure 9B:
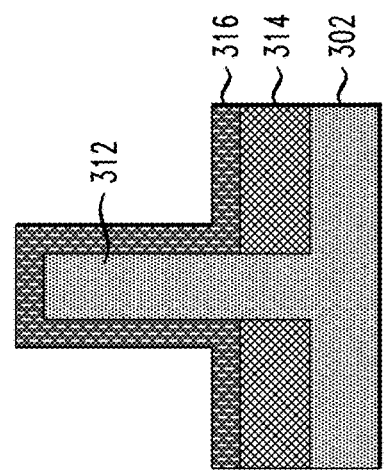
FIG. 9B depicts a side cross-sectional view of the FIG. 8B thick gate dielectric region following channel release, according to an embodiment of the invention.
Figure 9C:
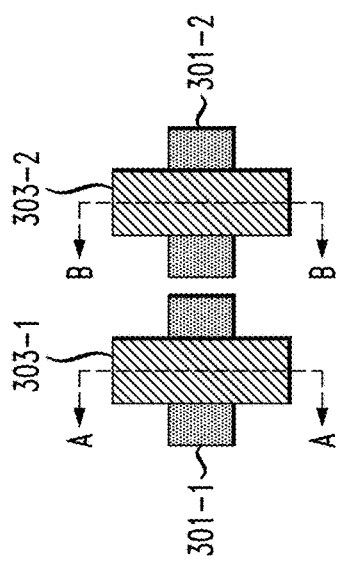
FIG. 9C depicts a top-down view of the thin gate dielectric and thick gate dielectric regions of the semiconductor structure shown in FIGS. 9A and 9B, according to an embodiment of the invention.
Figure 9A:
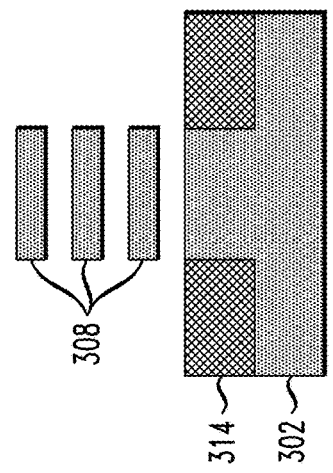
FIG. 9A depicts a side cross-sectional view of the FIG. 8A thin gate dielectric region following channel release, according to an embodiment of the invention.

FIG. 9A depicts a side cross-sectional view 900 of the FIG. 8A thin gate dielectric region following channel release to remove sacrificial layers 306. Thus, as shown, only the channel layers 308 of the nanosheet stack remain. The channel release is a selective process that removes material of the sacrificial layers 306 selective to the material of the channel layers 308. Any suitable selective etching or other process for removal of sacrificial layers 306 selective to channel layers 308 may be used. For example, in embodiments where the sacrificial layers 306 are SiGe and the channel layers are Si, a wet etch by SC1 etchant may be used.

FIG. 9B depicts a side cross-sectional view 950 of the FIG. 8B thick gate dielectric region, after the OPL 324 is stripped and after channel release. As the thick gate dielectric region in this embodiment does not include sacrificial material, the fin 312 remains the same and is not etched. The side cross-sectional view 900 of FIG. 9A is taken along the line A-A of the top-down view 975 of FIG. 9C, and the side cross-sectional view 950 of FIG. 9B is taken along the line B-B of the top-down view 975 of FIG. 9C.

Figure 10B:
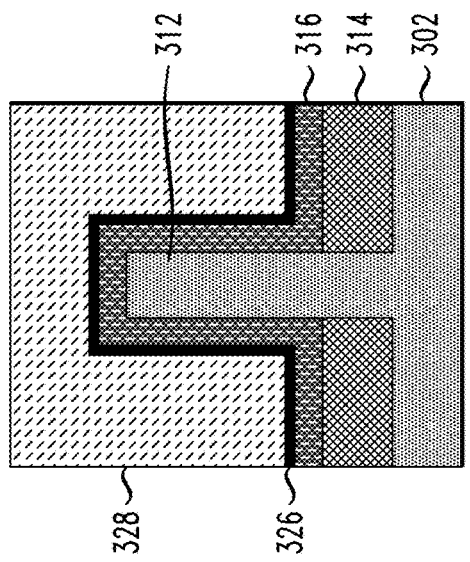
FIG. 10B depicts a side cross-sectional view of the FIG. 9B thick gate dielectric region following formation of the thin gate dielectric and gate material, according to an embodiment of the invention.
Figure 10C:
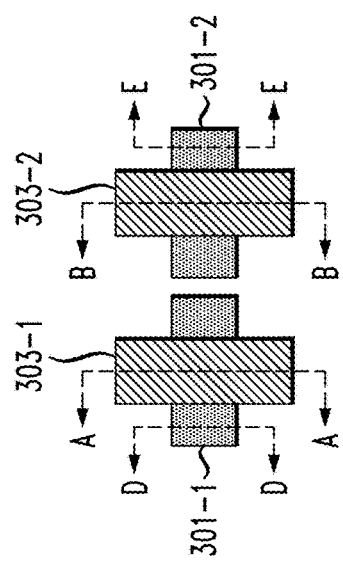
FIG. 10C depicts a top-down view of the thin gate dielectric and thick gate dielectric regions of the semiconductor structure illustrated in FIGS. 10A, 10B, 10D and 10E, according to an embodiment of the invention.
Figure 10A:
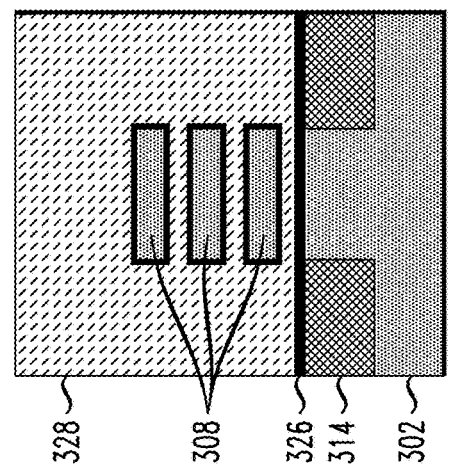
FIG. 10A depicts a side cross-sectional view of the FIG. 9A thin gate dielectric region following formation of a thin gate dielectric surrounding the nanosheets in the nanosheet stack and formation of gate material surrounding the thin gate dielectric, according to an embodiment of the invention.

FIG. 10A depicts a side cross-sectional view 1000 of the FIG. 9A thin gate dielectric region following formation of a thin gate dielectric layer 326 surrounding the nanosheet channels 308 and over a top surface of the STI 314 and substrate 302 in the thin gate dielectric region. The thin gate dielectric layer 326, also referred to herein as dielectric layer 326, may be a high-k dielectric. As used herein, the term "high-k dielectric" refers to a material having a dielectric constant k that is higher than that of $SiO_2$. Examples of high-k materials include but are not limited to metal oxides such as hafnium oxide ($HfO_2$), hafnium silicon oxide (HfSiO), lanthanum oxide ($La_2O_3$), lanthanum aluminum oxide ($LaAlO_3$), zirconium oxide ($ZrO_2$), zirconium silicon oxide (ZrSiO), zirconium silicon oxynitride (ZrSiON), tantalum oxide ($Ta_2O_5$), titanium oxide ($TiO_2$), barium strontium titanium oxide ($BaO_6SrTi_2$), barium titanium oxide ($BaO_3Ti$), strontium titanium oxide ($SrTiO_3$), yttrium oxide ($Y_2O_3$), aluminum oxide ($Al_2O_3$), lead scandium tantalum oxide (OPbScTa), and lead zinc niobate ($Pb(Zn_{1/3}Nb_{2/3})O_3$). The high-k dielectric may further include dopants such as lanthanum (La) and aluminum (Al).

The dielectric layer 326 may be formed using ALD or other suitable processing. The dielectric layer 326 may have a uniform thickness in the range of 0.5 nm to 2 nm.

A conductive gate layer 328 is formed over the dielectric layer 326, filling regions between the nanosheet channels 308 of the nanosheet stack as illustrated. The conductive gate layer 328 may be formed of a WFM such as titanium nitride (TiN), although other suitable materials may be used. The conductive gate layer 328 may have a height or vertical thickness, measured from a top surface of the dielectric layer 326 formed over the STI 314 and substrate 302 in FIG. 10A, ranging from 60 nm to 100 nm.

Figure 10E:
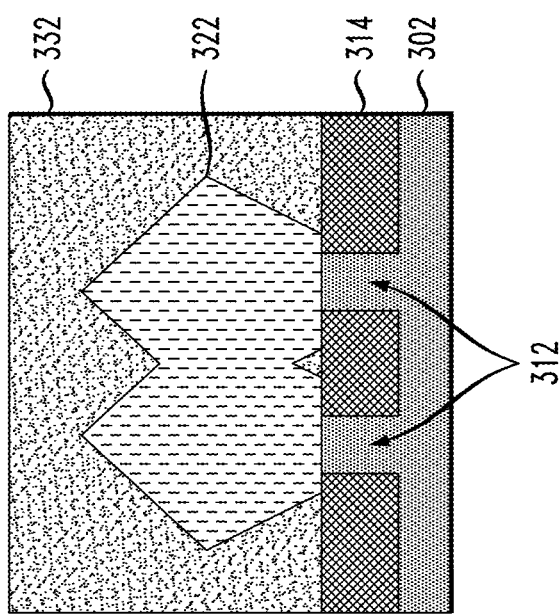
FIG. 10E depicts a side cross-sectional view of the source/drain regions surrounding the FIG. 10B thick gate dielectric region, according to an embodiment of the invention.
Figure 10D:
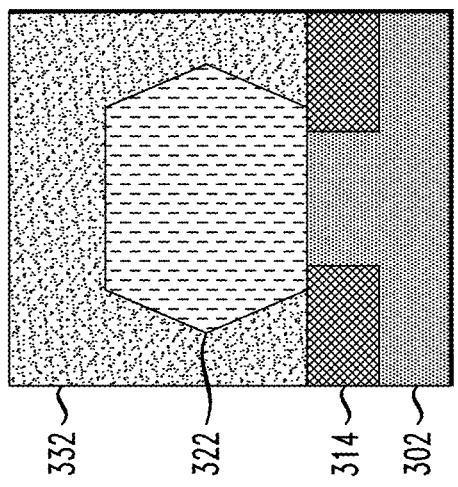
FIG. 10D depicts a side cross-sectional view of the source/drain regions surrounding the FIG. 10A thin gate dielectric region, according to an embodiment of the invention.

The side cross-sectional view 1000 of FIG. 10A is taken along the line A-A in the top-down view 1075 of FIG. 10C, and the side cross-sectional view 1050 of FIG. 10B is taken along the line B-B in the top-down view 1075 of FIG. 10C. The side cross-sectional views 1000 and 1050 of FIGS. 10A and 10B are considered views "under" the gate regions 303-1 and 303-2 of the nanosheet FET and the FinFET, respectively. FIGS. 10D and 10E show additional cross-sectional views "under" the source/drain region 301. FIG. 10D shows a side cross-sectional view 1085 taken along the line D-D in the top-down view 1075 of FIG. 10C, and FIG. 10E shows a side cross-sectional view 1095 taken along the line E-E in the top down view 1075 of FIG. 10C. The side cross-sectional views 1085 and 1095 of FIGS. 10D and 10E are views under the source/drain regions 301 of the nanosheet FET and the FinFET, respectively.

The side cross-sectional view 1085 of FIG. 10D shows the source/drain epitaxial layers 322, as well as an interlayer dielectric (ILD) 332. Contacts to the source/drain epitaxial layers 322 will later be formed in regions occupied by interlayer dielectric 332. Although only one nanosheet FET is illustrated, it is to be appreciated that multiple nanosheet FETs may be formed, by patterning multiple nanosheet stacks using processing similar to that described above.

The side cross-sectional view 1095 of FIG. 10E shows the source/drain epitaxial layers 322, as well as ILD 332. For illustration, two fins 312 are shown in FIG. 10E. It is to be appreciated, however, that any desired number of fins may be used, including only a single fin, based on the number of FinFETs to be formed.

The shape of the source/drain epitaxial layers 322 may be quadrilateral, pentagonal, etc. as desired and depending on orientations and materials used during epitaxial growth or formation of the source/drain epitaxial layers 322.

FIGS. 3-10 describe a processing flow where a semiconductor for the FinFET is patterned first in both the thin gate dielectric and thick gate dielectric regions, followed by masking of the thick gate dielectric region and formation of the nanosheet stack in the thin gate dielectric region. As an alternative, the nanosheet stack may be first patterned in both the thin gate and thick gate dielectric regions, followed by masking of the nanosheet stack in the thin gate dielectric region and formation of semiconductor fin material in the thick gate dielectric region. Such an alternative is illustrated in FIGS. 11-13. Blanket formation of the nanosheet stack first in both the thin gate dielectric and thick gate dielectric regions may avoid potential issues associated with patterned epitaxy of the nanosheet stacks.

Figure 11B:
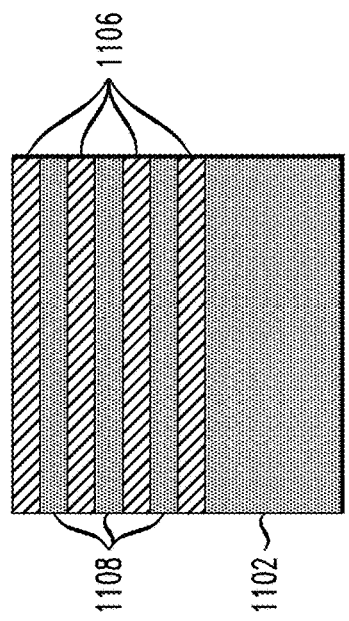
FIG. 11B depicts a side cross-sectional view of a thick gate dielectric region of the semiconductor structure having a semiconductor substrate with a nanosheet stack formed over a top surface thereof, according to an embodiment of the invention.
Figure 11C:
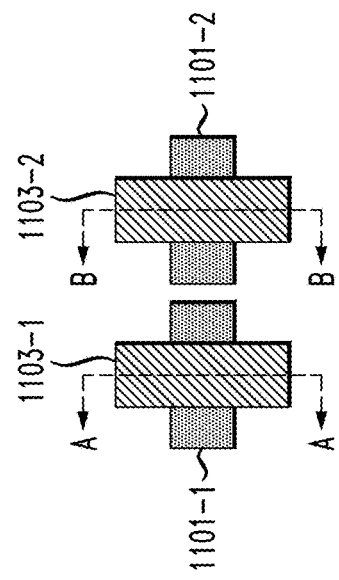
FIG. 11C depicts a top-down view of the thin gate dielectric and thick gate dielectric regions of the semiconductor structure shown in FIGS. 11A and 11B, according to an embodiment of the invention.
Figure 11A:
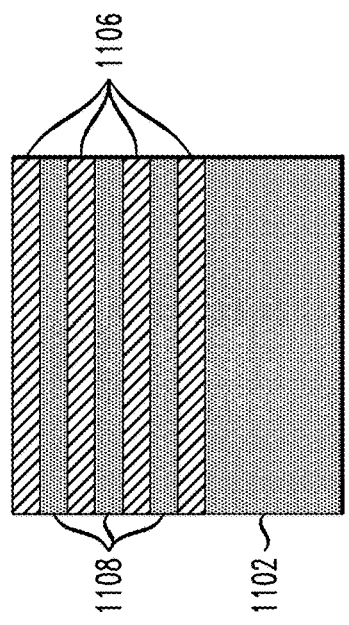
FIG. 11A depicts a side cross-sectional view of a thin gate dielectric region of a semiconductor structure having a semiconductor substrate with a nanosheet stack formed over a top surface thereof, according to an embodiment of the invention.

FIG. 11A depicts a side cross-sectional view 1100 of a thin gate dielectric region of a semiconductor structure. The thin gate dielectric region includes substrate 1102, which may be formed with material and sizing similar to that of substrate 302, with a nanosheet stack of sacrificial layers 1106 and channel layers 1108 formed over the substrate 1102. The nanosheet stack of sacrificial layers 1106 and channel layers 1108 may be formed with materials and sizing similar to the nanosheet stack of sacrificial layers 306 and channel layers 308.

FIG. 11B depicts a side cross-sectional view 1150 of a thick gate dielectric region of the semiconductor structure, also having substrate 1102 with the nanosheet stack of sacrificial layers 1106 and channel layers 1108 formed over the surface thereof.

FIG. 11C depicts a top-down view 1175 of source/drain regions 1101 and gate regions 1103. The side cross-sectional view 1100 of FIG. 11A is taken along the line A-A in the top-down view 1175 of FIG. 11C, while the side cross-sectional view 1150 of FIG. 11B is taken along the line B-B in the top-down view 1175 of FIG. 11C. The top-down view 1175 more particularly illustrates source/drain regions 1101-1 and 1101-2 (collectively, source/drain regions 1101), and gate regions 1103-1 and 1103-2 (collectively, source/drain regions 1103). The source/drain regions 1101 and gate regions 1103 are formed on a common substrate (e.g., substrate 1102).

Figure 12B:
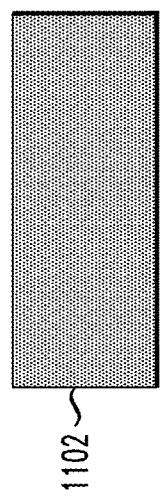
FIG. 12B depicts a side cross-sectional view of the FIG. 11B thick gate dielectric region following removal of the nanosheet stack while the thin gate dielectric region is protected by the hard mask, according to an embodiment of the invention.
Figure 12C:
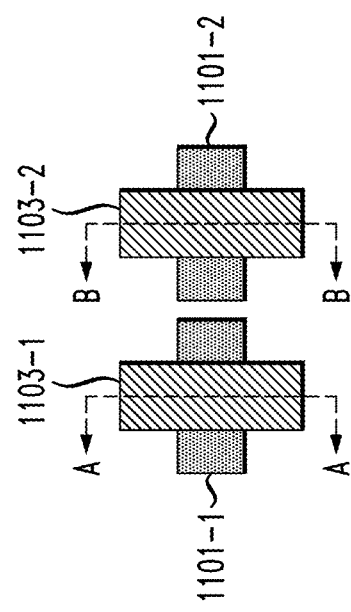
FIG. 12C depicts a top-down view of the thin gate dielectric and thick gate dielectric regions of the semiconductor structure shown in FIGS. 12A and 12B, according to an embodiment of the invention.
Figure 12A:
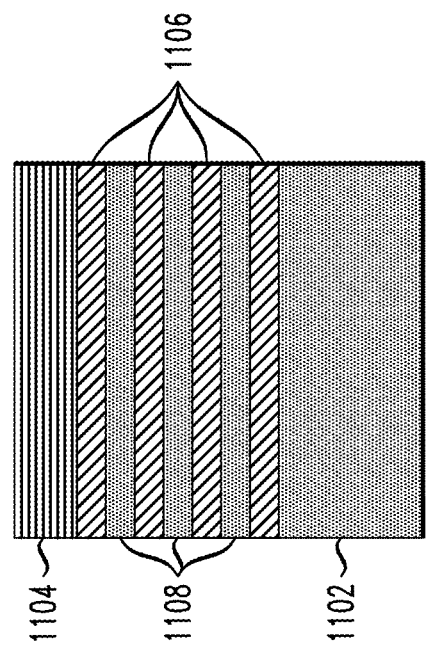
FIG. 12A depicts a side cross-sectional view of the FIG. 11A thin gate dielectric region following formation of a hard mask over the nanosheet stack in the thin gate dielectric region, according to an embodiment of the invention.

FIG. 12A depicts a side cross-sectional view 1200 of the FIG. 11A thin gate dielectric region following patterning of a hard mask 1104 over the nanosheet stack in the thin gate dielectric region. The hard mask 1104 may be formed of a similar material and with similar size as that of the hard mask 304. FIG. 12B shows a side cross-sectional view 1250 of the FIG. 11B thick gate dielectric region, illustrating that the thick gate dielectric region is left open while the thin gate dielectric region has the hard mask 1104 formed over a top surface thereof. The side cross-sectional view 1200 of FIG. 12A is taken along the line A-A of the top-down view 1275 of FIG. 12C, and the side cross-sectional view 1250 of FIG. 12B is taken along the line B-B of the top-down view 1275 of FIG. 12C.

Figure 13B:
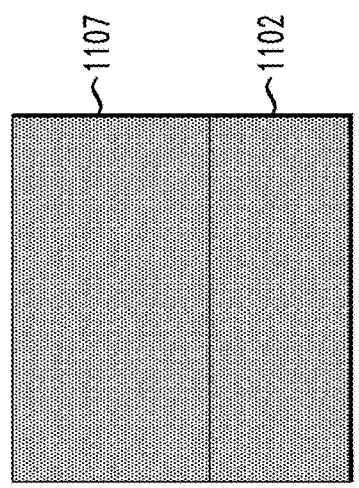
FIG. 13B depicts a side cross-sectional view of the FIG. 12B thick gate dielectric region following selective epitaxial growth in the thick gate dielectric region, according to an embodiment of the invention.
Figure 13C:
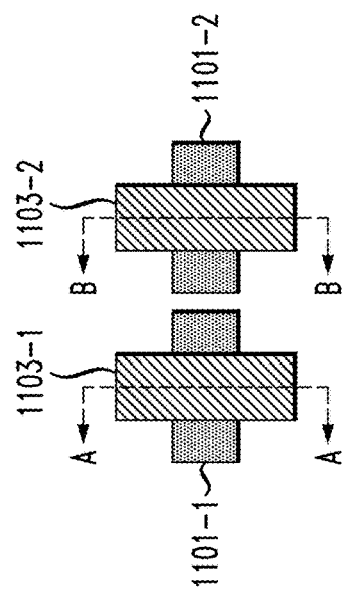
FIG. 13C depicts a top-down view of the thin gate dielectric and thick gate dielectric regions of the semiconductor structure shown in FIGS. 13A and 13B, according to an embodiment of the invention.
Figure 13A:
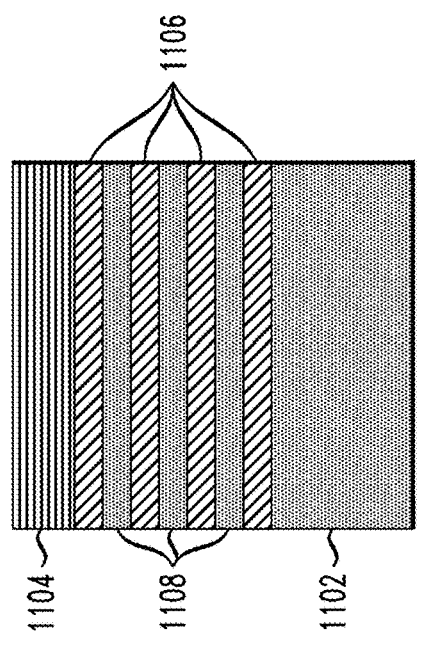
FIG. 13A depicts a side cross-sectional view of the FIG. 12A thin gate dielectric region, showing the nanosheet stack in the thin gate dielectric region protected by the hard mask during selective epitaxial growth in the thick gate dielectric region, according to an embodiment of the invention.

FIG. 13A depicts a side cross-sectional view 1300 of the FIG. 12A thin gate dielectric region, showing the nanosheet stack in the thin gate dielectric region protected by hard mask 1104 during selective epitaxial growth of fin material in the thick gate dielectric region. FIG. 13B depicts a side cross-sectional view 1350 of the FIG. 12B thick gate dielectric region, following etching of the nanosheet stack and selective epitaxial growth of fin material 1107 in the thick gate dielectric region. The fin material 1107 may be, for example, Si or another suitable material as described above. The side cross-sectional view 1300 of FIG. 13A is taken along the line A-A of the top-down view 1375 of FIG. 13C, and the side cross-sectional view 1350 of FIG. 13B is taken along the line B-B of the top-down view 1375 of FIG. 13C.

Following the processing of FIG. 13, the flow may resume with processing described above with respect to FIGS. 5-10.

In some embodiments, a sacrificial layer such as a self-aligned punch-through stop (PTS) layer may be formed beneath the fins in the thick gate dielectric region. After etching the nanosheet stack in the thick gate dielectric region while the nanosheet stack is protected by a hard mask in the thin gate dielectric region, in-situ doped Si as a sacrificial layer may be grown first over the substrate followed by un-doped Si or another suitable fin material. Thus, a self-aligned sacrificial layer for a thick gate dielectric region may be formed without an additional mask procedure. Such arrangements are described in detail below with respect to FIGS. 14-21. While FIGS. 14-21 are described assuming that the nanosheet stack is formed first in both the thin gate dielectric and thick gate dielectric regions, it is to be appreciated that similar steps may be used if the semiconductor for the FinFET is patterned first in both the thin gate dielectric and thick gate dielectric regions.

Figure 14B:
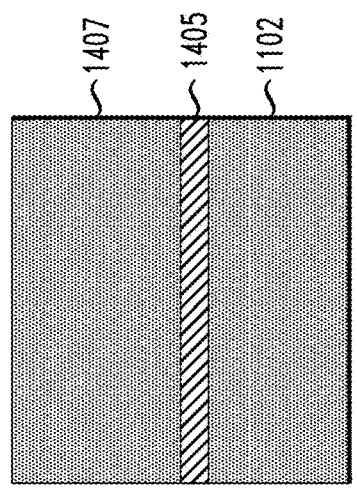
FIG. 14B depicts a side cross-sectional view of the FIG. 12B thick gate dielectric region following first and second selective epitaxial growths in the thick gate dielectric region, according to an embodiment of the invention.
Figure 14C:
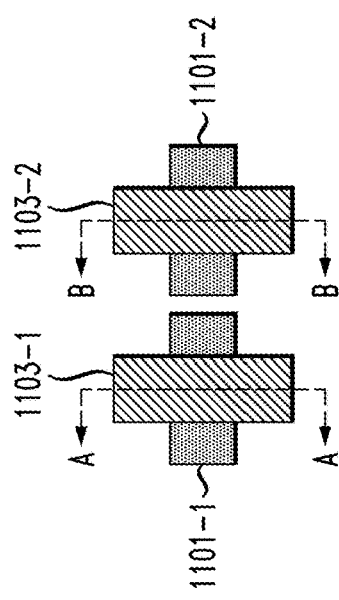
FIG. 14C depicts a top-down view of the thin gate dielectric and thick gate dielectric regions of the semiconductor structure shown in FIGS. 14A and 14B, according to an embodiment of the invention.
Figure 14A:
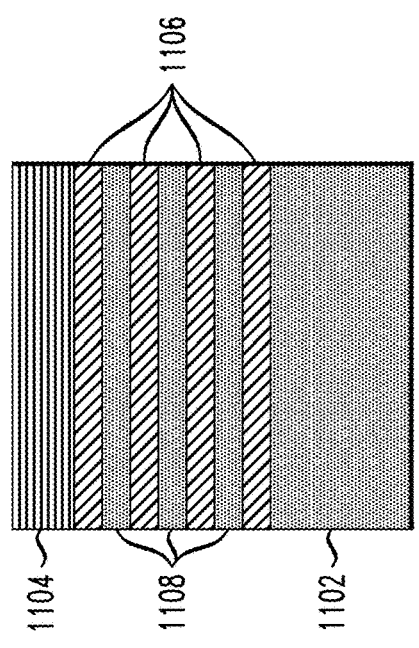
FIG. 14A depicts a side cross-sectional view of the FIG. 12A thin gate dielectric region, showing the nanosheet stack in the thin gate dielectric region protected by the hard mask during selective epitaxial growth in the thick gate dielectric region, according to an embodiment of the invention.

FIG. 14A depicts a side cross-sectional view 1400 of the FIG. 12A thin gate dielectric region, showing the nanosheet stack in the thin gate dielectric region protected by hard mask 1104. FIG. 14B depicts a side cross-sectional view 1450 of the FIG. 12B thick gate dielectric region where a sacrificial layer 1405 is formed over a top surface of the substrate 1102, followed by formation of fin material 1407 over a top surface of the sacrificial layer 1405. The sacrificial layer 1405, as described above, may be formed of a doped Si material, such as doped SiGe, although other suitable materials such as SiGe may be used. The sacrificial layer 1405 may have a height or vertical thickness (in direction Y-Y') ranging from 6 nm to 20 nm. For downstream process compatibility, it may be desired to have a top surface of the fin material 1407 in the thick gate dielectric region match a height of a top surface of the nanosheet stack in the thin gate dielectric region. The side cross-sectional view 1400 of FIG. 14A is taken along the line A-A of the top-down view 1475 of FIG. 14C, and the side cross-sectional view 1450 of FIG. 14B is taken along the line B-B of the top-down view 1475 of FIG. 14C.

The structure of FIG. 14 may undergo processing similar to that described above with respect to FIGS. 5-8, including formation of fin 1412 in the thick gate dielectric region, and formation of STI regions 1114 in both the thin gate dielectric and thick gate dielectric regions. The fin 1412 may have a width $D_{fin}$ similar to that of fin 312 described above. The STI regions 1114 may have similar size and be formed of similar materials as STI regions 314. The channel release, however, will differ as described below due to the presence of the sacrificial layer 1405 in the thick gate dielectric region.

Figure 15B:
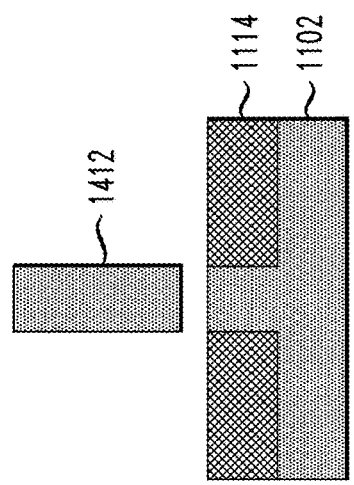
FIG. 15B depicts a side cross-sectional view of the FIG. 14B thick gate dielectric region following channel release, according to an embodiment of the invention.
Figure 15C:
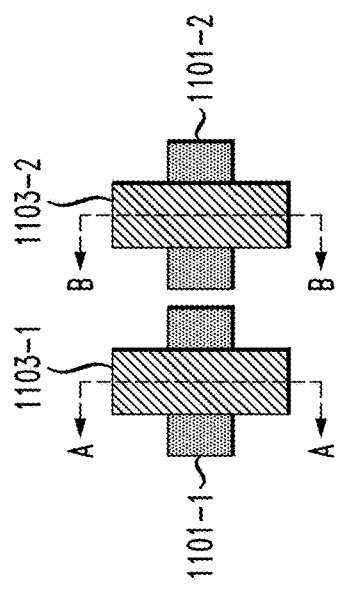
FIG. 15C depicts a top-down view of the thin gate dielectric and thick gate dielectric regions of the semiconductor structure shown in FIGS. 15A and 15B, according to an embodiment of the invention.
Figure 15A:
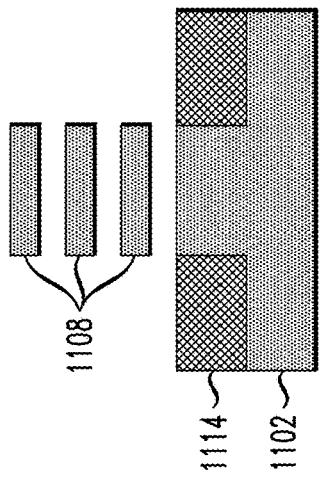
FIG. 15A depicts a side cross-sectional view of the FIG. 14A thin gate dielectric region following channel release, according to an embodiment of the invention.

FIG. 15A depicts a side cross-sectional view 1500 of the FIG. 14A thin gate dielectric region following processing similar to that described above with respect to FIGS. 5-8 and following channel release. As illustrated, the thin gate dielectric region shown in FIG. 15A is similar to that of the thin gate dielectric region shown in FIG. 9A.

FIG. 15B depicts a side cross-sectional view 1550 of the FIG. 14B thick gate dielectric region following processing similar to that described above with respect to FIGS. 5-8 and following channel release. During channel release, the sacrificial layer 1405 is removed as illustrated. The side cross-sectional view 1500 of FIG. 15A is taken along the line A-A of the top-down view 1575 of FIG. 15C, and the side cross-sectional view 1550 of FIG. 15B is taken along the line B-B of the top-down view 1575 of FIG. 15C.

Figure 16B:
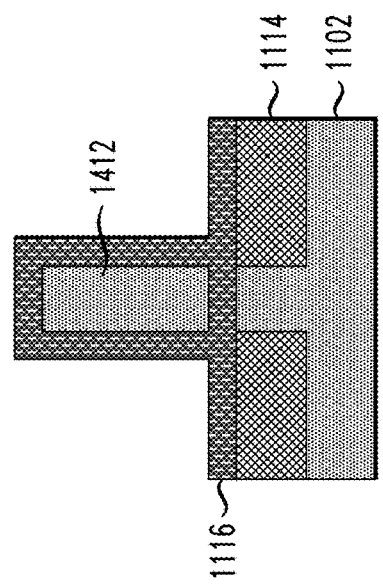
FIG. 16B depicts a side cross-sectional view of the FIG. 15B thick gate dielectric region following formation of the thick gate dielectric material, according to an embodiment of the invention.
Figure 16C:
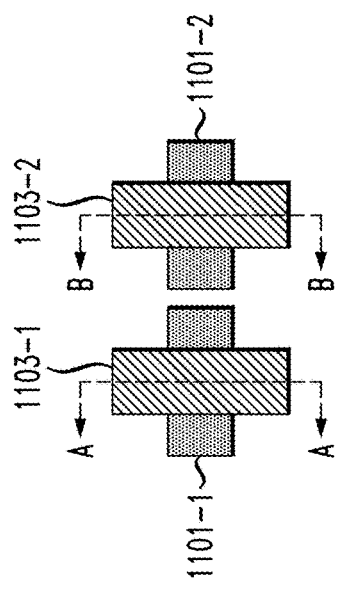
FIG. 16C depicts a top-down view of the thin gate dielectric and thick gate dielectric regions of the semiconductor structure shown in FIGS. 16A and 16B, according to an embodiment of the invention.
Figure 16A:
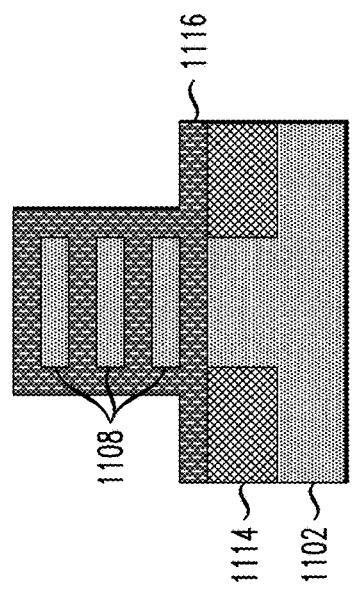
FIG. 16A depicts a side cross-sectional view of the FIG. 15A thin gate dielectric region following formation of thick gate dielectric material, according to an embodiment of the invention.

FIG. 16A depicts a side cross-sectional view 1600 of the FIG. 15A thin gate dielectric region following formation of thick gate dielectric layer 1116. The thick gate dielectric layer 1116 may be formed with similar materials and with similar size as the thick gate dielectric layer 316. The thick gate dielectric layer 1116 is deposited after channel release to get into the bottom of the fin 1112. In this way, the fin 1112 is completely isolated from the substrate 1102.

FIG. 16B depicts a side cross-sectional view 1650 of the FIG. 15B thick gate dielectric region following formation of the thick gate dielectric layer 1116. Because the sacrificial layer 1405 was removed leaving space between a bottom surface of fin 1112 and a top surface of the substrate 1102, the thick gate dielectric layer 1116 surrounds all sides of the fin 1112. The side cross-sectional view 1600 of FIG. 16A is taken along the line A-A of the top-down view 1675 of FIG. 16C, and the side cross-sectional view 1650 of FIG. 16B is taken along the line B-B of the top-down view 1675 of FIG. 16C.

Figure 17B:
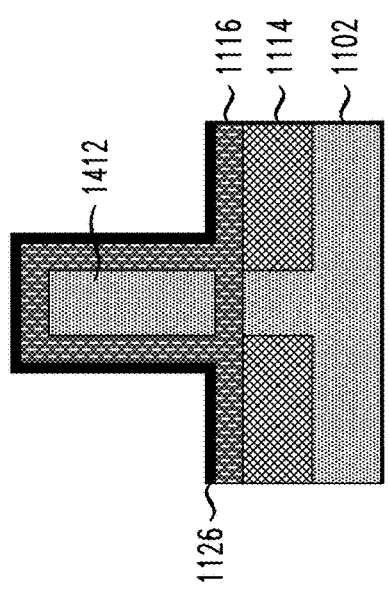
FIG. 17B depicts a first side cross-sectional view of the FIG. 16B thick gate dielectric region following formation of the thin gate dielectric material, according to an embodiment of the invention.
Figure 17C:
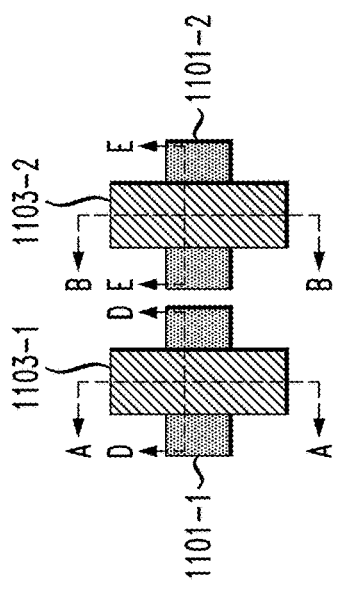
FIG. 17C depicts a top-down view of the thin gate dielectric and thick gate dielectric regions of the semiconductor structure illustrated in FIGS. 17A, 17B, 17D and 17E, according to an embodiment of the invention.
Figure 17A:
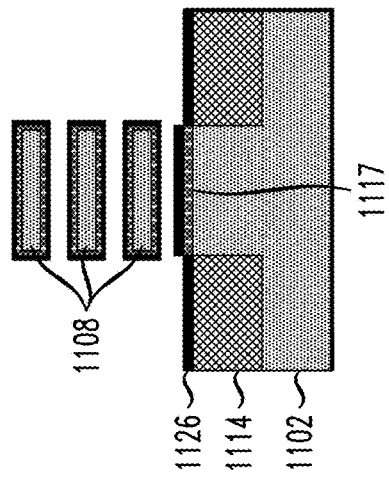
FIG. 17A depicts a first side cross-sectional view of the FIG. 16A thin gate dielectric region following removal of the thick gate dielectric material in the thin gate dielectric region and formation of the thin gate dielectric material, according to an embodiment of the invention.
Figure 17E:
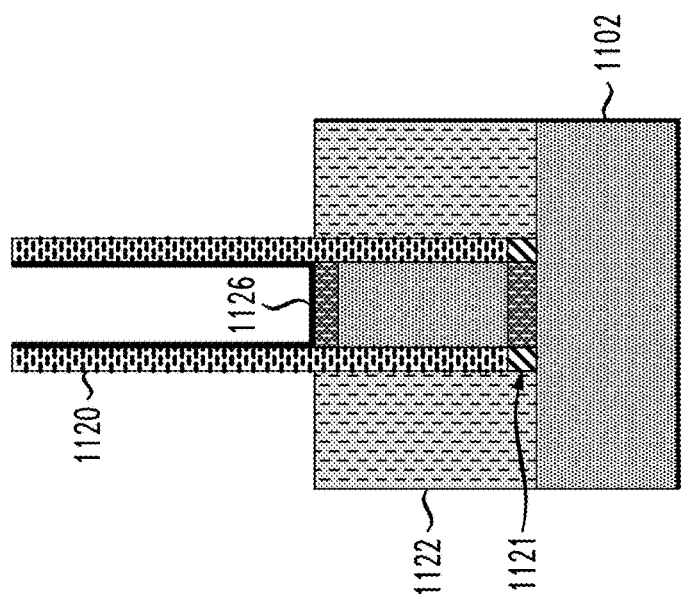
FIG. 17E depicts a second side cross-sectional view of the FIG. 16B thick gate dielectric region following formation of inner spacers, according to an embodiment of the invention.
Figure 17D:
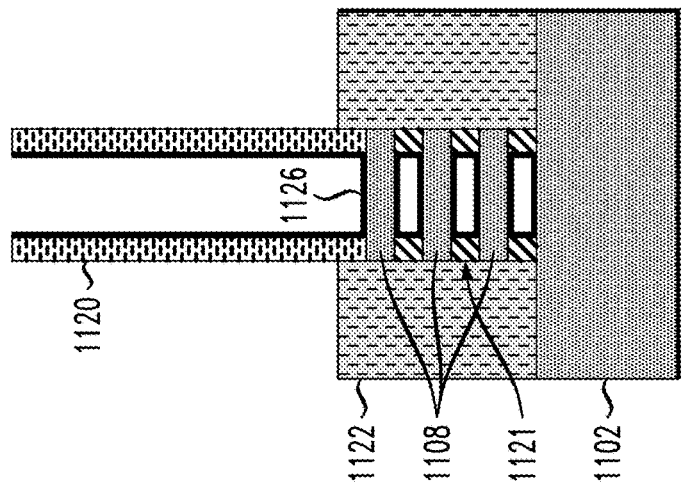
FIG. 17D depicts a second side cross-sectional view of the FIG. 16A thin gate dielectric region following formation of inner spacers, according to an embodiment of the invention.

FIGS. 17A-17E depict multiple views of the structure shown in FIGS. 16A and 16B following: (i) removal of the thick gate dielectric layer 1116 in the thin gate dielectric region (while the thick gate dielectric region is protected by an OPL layer similar to that described above with respect to OPL 324); and (ii) following formation of spacers 1120 and thin gate dielectric layer 1126, also referred to herein as dielectric layer 1126. FIG. 17A depicts a first side cross-sectional view 1700 of the thin gate dielectric region taken along the line A-A in the top-down view 1775 of FIG. 17C, FIG. 17B depicts a first side cross-sectional view 1750 of the thick gate dielectric region taken along the line B-B in the top-down view 1775 of FIG. 17C, FIG. 17D depicts a second side cross-sectional view 1785 of the thin gate dielectric region taken along the line D-D in the top-down view 1775 of FIG. 17C, and FIG. 17E depicts a second side cross-sectional view 1795 of the thick gate dielectric region taken along the line E-E in the top-down view 1775 of FIG. 17C. As shown in FIGS. 17A-17E, an interlayer (IL) 1117 is formed between the nanosheet channels 1108 and the dielectric layer 1126 (as well as between the top surface of the substrate 1102 and the dielectric layer 1116 in the thin gate dielectric region). An IL may also be formed in the embodiment described above with respect to FIGS. 1-10. As the IL may be very thin (e.g., have thickness in the sub-nm range) it is omitted in FIGS. 1-10 for clarity of illustration.

The spacers 1120 may be similar to the spacers 320 described above, and the dielectric layer 1126 may be similar to the dielectric layer 326 described above.

Inner spacers 1721 are formed in both the thin gate dielectric and thick gate dielectric regions as illustrated. The inner spacers 1721 may be formed by doing a recess etch to sacrificial SiGe, before growth of source/drain epitaxial layers. A conformal deposition of the material of inner spacers (e.g., a dielectric material) is performed to pinch off the gap formed by the recess etch. A conformal etch back is then performed to remove inner spacer material deposited in unwanted areas. Similar processing may be used to form spacers 321, although as noted above the spacers 321 are only formed in the thin gate dielectric region while spacers 1721 are formed in both the thin gate and thick gate dielectric regions.

The structure of FIG. 17 may be subject to further processing to form a conductive gate material, such as a WFM material, surrounding the nanosheet channels 1108 and fin 1112, similar to processing described above with respect to formation of the FIG. 10 structure.

The use of a sacrificial layer formed underneath the fin in the thick gate dielectric region may also be used for forming a gate all around (GAA) structure for the FinFET device in the thick gate dielectric region, as will now be described with respect to FIGS. 18-21.

FIG. 18A depicts a side cross-sectional view 1800 of the FIG. 12A thin gate dielectric region, showing the nanosheet stack in the thin gate dielectric region protected by hard mask 1104 during formation of sacrificial layer 1805 and fin material 1807 over the sacrificial layer 1805. FIG. 18B depicts a side cross-sectional view 1850 of the FIG. 12B thick gate dielectric region following formation of the sacrificial layer 1805 and fin material 1807. The sacrificial layer 1805 and fin material 1807 are similar to that described above with respect to sacrificial layer 1105 and fin material 1107, although their sizing differs. The sacrificial layer 1805 has a height or vertical thickness that is greater than twice the thickness of the thick gate dielectric layer plus the thickness of the conductive gate material (e.g., WFM material) formed between nanosheet channels 1108 in the nanosheet stack. In the FIG. 18 example, the sacrificial layer 1805 is formed with a height that matches that of the second sacrificial layer 1106-2 in the nanosheet stack in the thin gate dielectric region (e.g., a thickness matching a total thickness of sacrificial layer 1106-1, channel layer 1108-1 and sacrificial layer 1106-2).

The side cross-sectional view 1800 of FIG. 18A is taken along the line A-A of the top-down view 1875 of FIG. 18C, and the side cross-sectional view 1850 of FIG. 18B is taken along the line B-B of the top-down view 1875 of FIG. 18C.

Figure 19B:
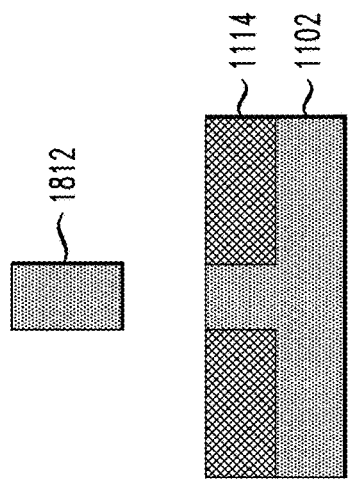
FIG. 19B depicts a side cross-sectional view of the FIG. 18B thick gate dielectric region following channel release, according to an embodiment of the invention.
Figure 19C:
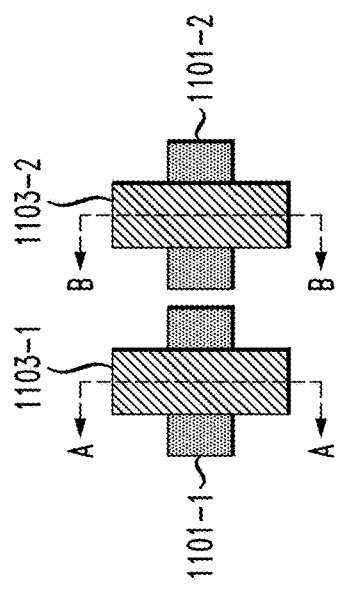
FIG. 19C depicts a top-down view of the thin gate dielectric and thick gate dielectric regions of the semiconductor structure shown in FIGS. 19A and 19B, according to an embodiment of the invention.
Figure 19A:
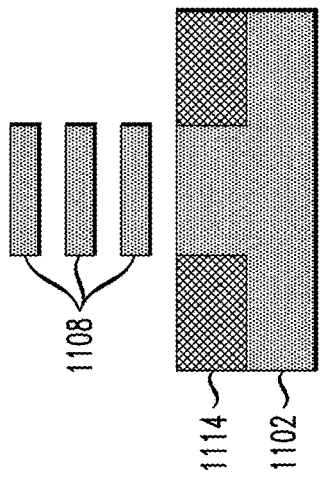
FIG. 19A depicts a side cross-sectional view of the FIG. 18A thin gate dielectric region following channel release, according to an embodiment of the invention.

FIG. 19A depicts a side cross-sectional view 1900 of the FIG. 18A thin gate dielectric region following processing similar to that described above with respect to FIGS. 5-8 and following channel release. As illustrated, the thin gate dielectric region shown in FIG. 18A is similar to that of the thin gate dielectric region shown in FIGS. 9A/15A.

FIG. 19B depicts a side cross-sectional view 1950 of the FIG. 18B thick gate dielectric region following processing similar to that described above with respect to FIGS. 5-8 and following channel release. During channel release, the sacrificial layer 1805 is removed as illustrated. Compared with the thick gate dielectric region shown in the side cross-sectional view 1550 of FIG. 15B, the thick gate dielectric region shown in the side cross-sectional view 1950 of FIG. 19B includes additional space between the top of the substrate 1102 and the bottom of the fin 1812, allowing room for subsequent formation of both the thick gate dielectric layer and the conductive gate material to form a GAA structure for a FinFET device.

The side cross-sectional view 1900 of FIG. 19A is taken along the line A-A of the top-down view 1975 of FIG. 19C, and the side cross-sectional view 1950 of FIG. 19B is taken along the line B-B of the top-down view 1975 of FIG. 19C.

Figure 20B:
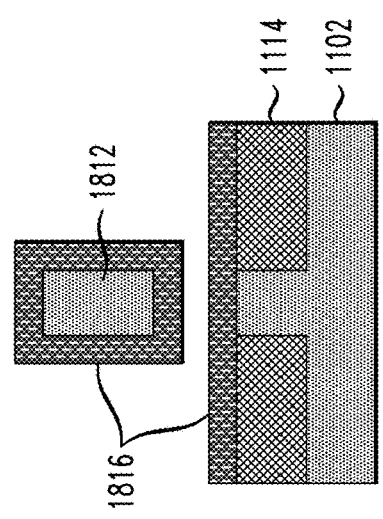
FIG. 20B depicts a side cross-sectional view of the FIG. 19B thick gate dielectric region following formation of the thick gate dielectric material, according to an embodiment of the invention.
Figure 20C:
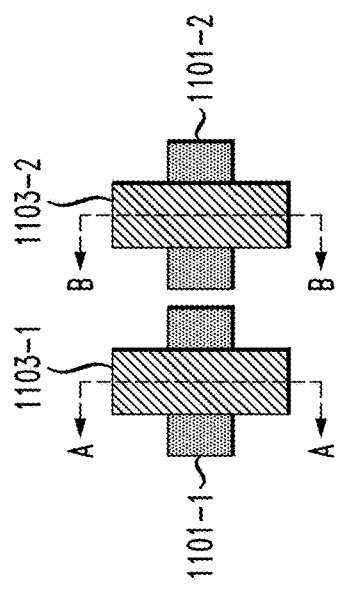
FIG. 20C depicts a top-down view of the thin gate dielectric and thick gate dielectric regions of the semiconductor structure shown in FIGS. 20A and 20B, according to an embodiment of the invention.
Figure 20A:
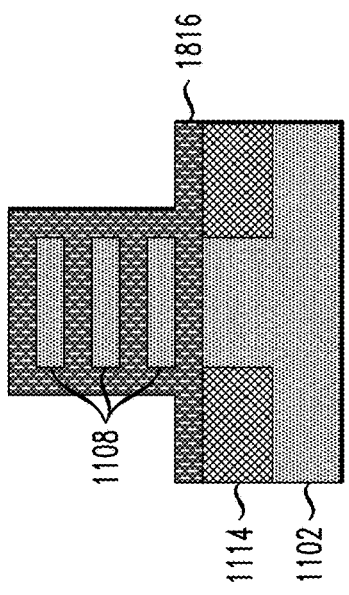
FIG. 20A depicts a side cross-sectional view of the FIG. 19A thin gate dielectric region following formation of thick gate dielectric material, according to an embodiment of the invention.

FIG. 20A depicts a side cross-sectional view 2000 of the FIG. 19A thin gate dielectric region following formation of thick gate dielectric layer 1816. The thick gate dielectric layer 1816, also referred to as dielectric layer 1816, may be formed with material and sizing similar to that of dielectric layers 316 and 1116.

FIG. 20B depicts a side cross-sectional view 2050 of the FIG. 19B thick gate dielectric region following formation of the thick gate dielectric layer 1816. The thick gate dielectric layer 1816 may have a thickness similar to that of thick gate dielectric layer 1116. However, as the sacrificial layer 1805 is thicker than the sacrificial layer 1105, there is still space remaining below the bottom of the fin 1812 and above the substrate 1102 for subsequent formation of conductive gate material to form a GAA FinFET device.

The side cross-sectional view 2000 of FIG. 20A is taken along the line A-A of the top-down view 2075 of FIG. 20C, and the side cross-sectional view 2050 of FIG. 20B is taken along the line B-B of the top-down view 2075 of FIG. 20C.

FIG. 21A depicts a side cross-sectional view 2100 of the FIG. 20A thin gate dielectric region following formation of thin gate dielectric layer 1816. The thin gate dielectric layer 1816, also referred to as dielectric layer 1816, is similar to that of the dielectric layer 1116 in sizing and material type. The formation of the dielectric layer 1816 is subsequent to: (i) blocking the thick gate dielectric region with an OPL; (ii) removal of the thick gate dielectric layer 1826 in the thin gate dielectric region; and (iii) formation of an interlayer (IL) 1817 surrounding the nanosheet channels 1108 in the nanosheet stack and over a top surface of the substrate 1102 in the thin gate dielectric region. As a result, the IL 1817 is formed surrounding the nanosheet channels 1108, and over the top surface of the substrate 1102 in the thin gate dielectric region. The dielectric layer 1826 is then deposited.

FIG. 21B depicts a side cross-sectional view 2150 of the FIG. 20B thick gate dielectric region following the processing described above with respect to FIG. 21A. As shown, thin gate dielectric layer 1826 is also formed in the thick gate dielectric region, and there is space remaining for formation of conductive gate material to form a GAA FinFET device.

The side cross-sectional view 2100 of FIG. 21A is taken along the line A-A of the top-down view 2175 of FIG. 21C, and the side cross-sectional view 2150 of FIG. 21B is taken along the line B-B of the top-down view 2175 of FIG. 21C.

In some embodiments, a method of forming a semiconductor structure includes forming a nanosheet stack disposed over a first portion of a substrate and a fin channel material disposed over a second portion of the substrate, patterning the nanosheet stack disposed over the first portion of the substrate to form two or more nanosheet channels for at least one nanosheet FET, patterning the fin channel material disposed over the second portion of the substrate to form one or more fins for at least one FinFET, forming a first dielectric layer surrounding the nanosheet channels and the one or more fins, patterning a mask layer over the one or more fins, removing the first dielectric layer surrounding the nanosheet channels, removing the mask layer, forming a second dielectric layer surrounding the nanosheet channels and over the first dielectric layer surrounding the one or more fins, and forming a gate conductive layer over the second dielectric layer.

Forming the nanosheet stack disposed over the first portion of the substrate and the fin channel material disposed over the second portion of the substrate may comprise forming the fin channel material over a top surface of the substrate, forming a hard mask over a top surface of the fin channel material, patterning the hard mask to expose a first portion of the fin channel material disposed over the first portion of the substrate, etching the first portion of the fin channel material to expose the top surface of the first portion of the substrate, and forming the nanosheet stack over the top surface of the first portion of the substrate. Forming the nanosheet stack comprises epitaxial growth of alternating layers of a sacrificial material and a nanosheet channel material.

Patterning the nanosheet stack disposed over the first portion of the substrate to form the two or more nanosheet channels for said at least one nanosheet FET and patterning the fin channel material disposed over the second portion of the substrate to form the one or more fins for said at least one FinFET may comprise patterning a hard mask over a first portion of a top surface of the nanosheet stack and over a second portion of a top surface of the fin channel material and etching exposed portions of the nanosheet stack and the fin channel material into at least a portion of the substrate. The first portion of the top surface of the nanosheet stack may have a first width and the second portion of the top surface of the fin channel material may have a second width, the second width being smaller than the first width.

Forming the nanosheet stack disposed over the first portion of the substrate and the fin channel material disposed over the second portion of the substrate may comprise forming the nanosheet stack over a top surface of the substrate, forming a hard mask over a top surface of the nanosheet stack disposed over a top surface of the first portion of the substrate, patterning the hard mask to expose the top surface of the nanosheet stack disposed over the top surface of the second portion of the substrate, etching the nanosheet stack formed over the second portion of the substrate, and forming the fin channel material over the second portion of the substrate.

Forming the nanosheet stack disposed over the first portion of the substrate and the fin channel material disposed over the second portion of the substrate may comprise forming the nanosheet stack over a top surface of the substrate, forming a hard mask over a top surface of the nanosheet stack disposed over a top surface of the first portion of the substrate, patterning the hard mask to expose the top surface of the nanosheet stack disposed over the top surface of the second portion of the substrate, etching the nanosheet stack formed over the second portion of the substrate, forming a thick gate sacrificial layer over a top surface of the second portion of the substrate, and forming the fin channel material over a top surface of the thick gate sacrificial layer.

In some embodiments, the nanosheet stack comprises alternating layers of a sacrificial material and the nanosheet channel material, and the thick gate sacrificial layer has a thickness at least equal to a thickness of a bottommost layer of the sacrificial material disposed over the top surface of the first portion of the substrate. The method may further comprise performing channel release prior to forming the first dielectric layer, the channel release removing: (i) the layers of the sacrificial material from the nanosheet stack; and (ii) the thick gate sacrificial layer. Forming the first dielectric layer may comprise forming the first dielectric layer in a region exposed by removal of the thick gate sacrificial layer between: (i) a top surface of the second portion of the substrate; and (ii) a bottom surface of the one or more fins.

In other embodiments, the nanosheet stack comprises alternating layers of a sacrificial material and the nanosheet channel material, and the thick gate sacrificial layer has a thickness at least equal to: (i) twice a thickness of the first dielectric layer plus (ii) a thickness of the gate conductive layer between an adjacent pair of the nanosheet channels. The method may further comprise performing channel release prior to forming the first dielectric layer, the channel release removing: (i) the layers of the sacrificial material from the nanosheet stack; and (ii) the thick gate sacrificial layer. Forming the first dielectric layer may comprise forming the first dielectric layer using a conformal deposition process to surround: a top surface of the second portion of the substrate; and a bottom surface of the one or more fins, wherein the conformal deposition process leaves an empty space between: portions of the first dielectric layer disposed on the top surface of the second portion of the substrate; and portions of the first dielectric layer disposed on the bottom surface of the one or more fins. Forming the second dielectric layer may comprise forming the second dielectric layer in a portion of the empty space: (i) over the first dielectric layer surrounding the one or more fins; and (ii) over the first dielectric layer disposed over the top surface of the second portion of the substrate. Forming the gate conductive layer may comprise forming the gate conductive layer in a remaining portion of the empty space. Thus, said at least one FinFET device may comprise a gate-all-around fin structure.

In some embodiments, a semiconductor structure comprises a substrate, two or more nanosheet channels of at least one nanosheet FET disposed over a first portion of the substrate, one or more fins of at least one FinFET disposed over a second portion of the substrate, a first dielectric layer disposed surrounding the one or more fins, a second dielectric layer disposed surrounding the two or more nanosheet channels and the first dielectric layer, and a gate conductive layer disposed surrounding the second dielectric layer. Said at least one FinFET may comprises input/output transistors for a device comprising said at least one FinFET and said at least one nanosheet FET.

In some embodiments, an integrated circuit comprises a semiconductor device having at least one nanosheet FET and at least one FinFET. The semiconductor device comprises a substrate, two or more nanosheet channels of said at least one nanosheet FET disposed over a first portion of the substrate, one or more fins of said at least one FinFET disposed over a second portion of the substrate, a first dielectric layer disposed surrounding the one or more fins, a second dielectric layer disposed surrounding the two or more nanosheet channels and the first dielectric layer, and a gate conductive layer disposed surrounding the second dielectric layer. Said at least one FinFET may comprise input/output transistors for the semiconductor device.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A semiconductor structure, comprising:
a substrate;
two or more nanosheet channels of at least one nanosheet field-effect transistor (FET) disposed over a first portion of the substrate;
one or more fins of at least one fin field-effect transistor (FinFET) disposed over a second portion of the substrate;
a first dielectric layer disposed surrounding the one or more fins;
a second dielectric layer disposed surrounding the two or more nanosheet channels and the first dielectric layer; and
a gate conductive layer disposed surrounding the second dielectric layer.

2. The semiconductor structure of claim 1, wherein said at least one FinFET comprises input/output transistors for a device comprising said at least one nanosheet FET.

3. The semiconductor structure of claim 1, wherein the first dielectric layer is further disposed between bottom surfaces of the one or more fins and a top surface of the substrate.

4. The semiconductor structure of claim 3, wherein a thickness of the first dielectric layer disposed between bottom surfaces of the one or more fins and a top surface of the substrate is at least equal to a space between a bottom surface of the bottommost one of the nanosheet channels and a top surface of the substrate.

5. The semiconductor structure of claim 3, wherein a thickness of the first dielectric layer disposed between bottom surfaces of the one or more fins and a top surface of the substrate is at least equal to (i) twice a space between a bottom surface of the bottommost one of the nanosheet channels and a top surface of the substrate plus (ii) a thickness of the gate conductive layer between an adjacent pair of the nanosheet channels.

6. The semiconductor structure of claim 1, wherein said at least one FinFET device comprises a gate-all-around fin structure.

7. The semiconductor structure of claim 1, wherein the first dielectric layer comprises an oxide and the second dielectric layer comprises a high-k dielectric material.

8. The semiconductor structure of claim 1, wherein the gate conductive layer disposed surrounding the second dielectric layer is formed between the two or more nanosheets channels of said at least one nanosheet FET.

9. The semiconductor structure of claim 8, wherein the gate conductive layer disposed surrounding the second dielectric layer surrounds sidewalls and a top surface of the one or more fins of said at least one FinFET.

10. The semiconductor structure of claim 1 further comprising shallow trench isolation regions disposed surrounding at least a portion of the substrate below the two or more nanosheet channels of said at least one nanosheet FET and surrounding at least a portion of sidewalls of the one or more fins of said at least one FinFET.

11. An integrated circuit comprising:
a semiconductor device having at least one nanosheet field-effect transistor (FET) and at least one fin field-effect transistor (FinFET), the semiconductor device comprising:
a substrate;
two or more nanosheet channels of said at least one nanosheet FET disposed over a first portion of the substrate;
one or more fins of said at least one FinFET disposed over a second portion of the substrate;
a first dielectric layer disposed surrounding the one or more fins;

a second dielectric layer disposed surrounding the two or more nanosheet channels and the first dielectric layer; and a gate conductive layer disposed surrounding the second dielectric layer.

12. The integrated circuit of claim 11, wherein said at least one FinFET comprises input/output transistors for the semiconductor device.

13. The integrated circuit of claim 11, wherein the first dielectric layer is further disposed between bottom surfaces of the one or more fins and a top surface of the substrate.

14. The integrated circuit of claim 13, wherein a thickness of the first dielectric layer disposed between bottom surfaces of the one or more fins and a top surface of the substrate is at least equal to a space between a bottom surface of the bottommost one of the nanosheet channels and a top surface of the substrate.

15. The integrated circuit of claim 13, wherein a thickness of the first dielectric layer disposed between bottom surfaces of the one or more fins and a top surface of the substrate is at least equal to (i) twice a space between a bottom surface of the bottommost one of the nanosheet channels and a top surface of the substrate plus (ii) a thickness of the gate conductive layer between an adjacent pair of the nanosheet channels.

16. The integrated circuit of claim 11, wherein said at least one FinFET device comprises a gate-all-around fin structure.

17. The integrated circuit of claim 11, wherein the first dielectric layer comprises an oxide and the second dielectric layer comprises a high-k dielectric material.

18. The integrated circuit of claim 11, wherein the gate conductor layer disposed surrounding the second dielectric layer is formed between the two or more nanosheets channels of said at least one nanosheet FET.

19. The integrated circuit of claim 18, wherein the gate conductor layer disposed surrounding the second dielectric layer surrounds sidewalls and a top surface of the one or more fins of said at least one FinFET.

20. The integrated circuit of claim 11, further comprising shallow trench isolation regions disposed surrounding at least a portion of the substrate below the two or more nanosheet channels of said at least one nanosheet FET and surrounding at least a portion of sidewalls of the one or more fins of said at least one FinFET.

* * * * *